(12) United States Patent
Hashimoto

(10) Patent No.: US 10,411,683 B2
(45) Date of Patent: Sep. 10, 2019

(54) INFORMATION PROCESSING DEVICE, INFORMATION PROCESSING METHOD, AND COMPUTER-READABLE RECORDING MEDIUM

(71) Applicant: FUJITSU LIMITED, Kawasaki-shi, Kanagawa (JP)

(72) Inventor: Tetsutaro Hashimoto, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 140 days.

(21) Appl. No.: 15/807,630

(22) Filed: Nov. 9, 2017

(65) Prior Publication Data

US 2018/0175838 A1 Jun. 21, 2018

(30) Foreign Application Priority Data

Dec. 19, 2016 (JP) .................................. 2016-245901

(51) Int. Cl.
*H03K 5/135* (2006.01)
*H03L 7/10* (2006.01)
*H03L 7/099* (2006.01)
*H03K 5/00* (2006.01)
*H03K 3/03* (2006.01)
*G04F 10/00* (2006.01)

(52) U.S. Cl.
CPC ............ *H03K 5/135* (2013.01); *H03L 7/099* (2013.01); *H03L 7/0995* (2013.01); *H03L 7/10* (2013.01); *G04F 10/005* (2013.01); *H03K 3/0315* (2013.01); *H03K 2005/00078* (2013.01); *H03L 2207/06* (2013.01); *H03L 2207/50* (2013.01)

(58) Field of Classification Search
CPC ....................................................... H03K 5/135
USPC ....................................................... 331/2, 1 A
See application file for complete search history.

(56) References Cited

U.S. PATENT DOCUMENTS

| 8,830,001 B2 * | 9/2014 | Zhuang ..................... H03C 5/00 331/1 A |
| 10,263,625 B1 * | 4/2019 | Tokairin .................. H03L 7/093 |
| 2010/0017042 A1 | 1/2010 | Lopata |
| 2014/0218009 A1 * | 8/2014 | Canard ................ G01R 29/023 324/76.39 |

(Continued)

FOREIGN PATENT DOCUMENTS

| JP | 7-253824 | 10/1995 |
| JP | 2004-199133 | 7/2004 |

(Continued)

*Primary Examiner* — Joseph Chang
(74) *Attorney, Agent, or Firm* — Fujitsu Patent Center

(57) ABSTRACT

A TDC measures a time difference between delay time that is in accordance with voltage variations. A DCO 155 generates an oscillation signal having a cycle that is in accordance with an input signal. A frequency divider 156 generates a divided signal by dividing the oscillation signal. An adder 154 inputs, to the DCO 155, a signal obtained by adding a second signal that changes an oscillation cycle of the DCO 155 in accordance with the time difference measured by the TDC to a first signal that is in accordance with a phase difference between the divided signal and a reference signal. A control circuit 11 obtains a measurement time resolution of the TDC and matches a cycle modulation time resolution of the DCO 155 with the measurement time resolution of the TDC.

7 Claims, 19 Drawing Sheets

(56) References Cited

U.S. PATENT DOCUMENTS

2014/0266341 A1\* 9/2014 Jang ................ H03L 7/085
327/156
2016/0072514 A1\* 3/2016 Tsai ................ H03K 3/011
331/47

FOREIGN PATENT DOCUMENTS

| JP | 2010-511247 | 4/2010 |
|---|---|---|
| WO | 2015008372 | 1/2015 |

\* cited by examiner

INFORMATION PROCESSING DEVICE, INFORMATION PROCESSING METHOD, AND COMPUTER-READABLE RECORDING MEDIUM

CROSS-REFERENCE TO RELATED APPLICATION

This application is based upon and claims the benefit of priority of the prior Japanese Patent Application No. 2016-245901, filed on Dec. 19, 2016, the entire contents of which are incorporated herein by reference.

FIELD

The embodiments discussed herein are related to an information processing device, an information processing method, and a computer-readable recording medium.

BACKGROUND

Digital circuits in Large Scale Integration (LSI) used for processors are operated in synchronization with clock signals. Furthermore, the LSI is driven by a power supply voltage supplied from a processor power supply.

The power supply voltage supplied to the LSI sometimes varies. For example, due to an effect of power supply noise generated due to large current consumption at a transition timing of a clock, a change in voltage of the frequency band determined based on the impedance, such as a power supply wiring, the stabilization capacity, or the like, is generated in the power supply voltage.

If the power supply voltage is decreased, there may be a case in which a speed of a signal propagated in a signal path in the LSI is decreased. In the signal path in the LSI, a critical path in which propagation of a signal within a cycle of a single clock is requested is present. If a speed of the signal is decreased, in a critical path having a small timing margin of the signal propagation in the signal path in the LSI, because a delay time is increased by an amount equal to or greater than the clock cycle and a timing error is generated, an appropriate data transfer is not able to be performed.

In order to avoid such a timing error, in the LSI used for processors, or the like, there is an LSI that adaptively controls the operating frequency in accordance with a decrease in power supply voltage. Specifically, control is performed such that voltage variations are converted to delay variations, a time difference is measured with respect to the subject delay variation by using a time-to-digital converter (TDC), the oscillation cycle of a phase locked loop (PLL) circuit is increased by an amount corresponding to the subject time difference.

Furthermore, as a technology for avoiding a timing error, there is a conventional technology for matching an amount of delay of a critical path circuit with that of a clock generation circuit by using, for the clock generation circuit, a circuit having the same configuration as that of the critical path circuit in the control circuit. Furthermore, there is a conventional technology for measuring a delay time in a control circuit and controlling a clock frequency in accordance with the measurement result. Furthermore, there is a conventional technology for adjusting a power supply voltage value with respect to an unmeasured operating frequency by using a critical path monitor circuit in which a correction is added based on the power supply voltage value that is associated with the measured operating frequency acquired from a table that is used to set the operating frequency of a CPU and a power supply voltage value. Furthermore, there is a conventional technology for storing data unique to a chip that provides variations in performance of a nonvolatile memory during a production test.

Patent Document 1: Japanese Laid-open Patent Publication No. 2004-199133

Patent Document 2: Japanese Laid-open Patent Publication No. 07-253824

Patent Document 3: International Publication Pamphlet No. WO 2015/008372

Patent Document 4: Japanese National Publication of International Patent Application No. 2010-511247

However, the measurement time resolution of a TDC and the cycle modulation time resolution of a digitally controlled oscillator (DCO) in a PLL are changed in accordance with the Process Voltage Temperature (PVT) condition representing the three conditions of a process, a voltage, and a temperature. Here, the PVT condition is designed such that the measurement time resolution of the TDC is equal to the cycle modulation time resolution of the DCO is set to a reference condition. If the process is slower than the reference condition, the measurement time resolution of the TDC is greater than that obtained under the reference condition and the frequency time resolution of the DCO is smaller than that obtained under the reference condition. In contrast, if the process is faster than the reference condition, the measurement time resolution of the TDC is smaller than that obtained under the reference condition and the frequency time resolution of the DCO is greater than that obtained under the reference condition. Furthermore, if the voltage is higher than the reference condition, the measurement time resolution of the TDC is smaller than that obtained under the reference condition and the frequency time resolution of the DCO is greater than that obtained under the reference condition. In contrast, if a voltage is lower than the reference condition, the measurement time resolution of the TDC is greater than that obtained under the reference condition and the frequency time resolution of the DCO is smaller than that obtained under the reference condition. In this way, the variations in delay time given by the variations in the processes and the voltages are opposite directions regarding the measurement time resolution of the TDC and the frequency time resolution of the DCO. Consequently, a change in the PVT condition may possibly decrease the accuracy of the adaptive frequency control.

Furthermore, even when using the conventional technology for using, for the clock generation circuit, the circuit having the same configuration as that of the critical path circuit in the control circuit, a difference between the measurement time resolution of the TDC and the frequency time resolution of the DCO is increased and it is difficult to improve the accuracy of the adaptive frequency control. Furthermore, in the conventional technology for controlling the clock frequency in accordance with the measurement result of the delay time in the control circuit, the variations in the processes or the like are not considered, and it is difficult to improve the accuracy of the adaptive frequency control. Furthermore, even when using the conventional technology for adjusting the power supply voltage value by using the critical path monitor circuit in which a correction is added based on the power supply voltage value with respect to the measured operating frequency, the difference between the measurement time resolution of the TDC and the frequency time resolution of the DCO is increased and thus it is difficult to improve the accuracy of the adaptive frequency control. Furthermore, it is difficult to allow the conventional technology for storing the data unique to the chip in a nonvolatile memory to handle the adjustment of the performance of the CPU and thus it is difficult to improve the accuracy of the adaptive frequency control.

SUMMARY

According to an aspect of an embodiment, an information processing device includes: a voltage variation detection unit that measures a time difference between delay time that is in accordance with voltage variations; an oscillator that generates an oscillation signal having a cycle that is in accordance with an input signal; a frequency divider that generates a divided signal by dividing the oscillation signal; an adder that inputs, to the oscillator, a signal obtained by adding a second signal that changes an oscillation cycle of the oscillator in accordance with the time difference measured by the voltage variation detection unit to a first signal that is in accordance with a phase difference between the divided signal and a reference signal; and a control unit that obtains a measurement time resolution of the voltage variation detection unit and that matches a cycle modulation time resolution of the oscillator with the measurement time resolution of the voltage variation detection unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. Furthermore, the information processing device, the information processing method, and the information processing program disclosed in the present invention are not limited to the embodiments described below.

[a] First Embodiment

Figure 1:
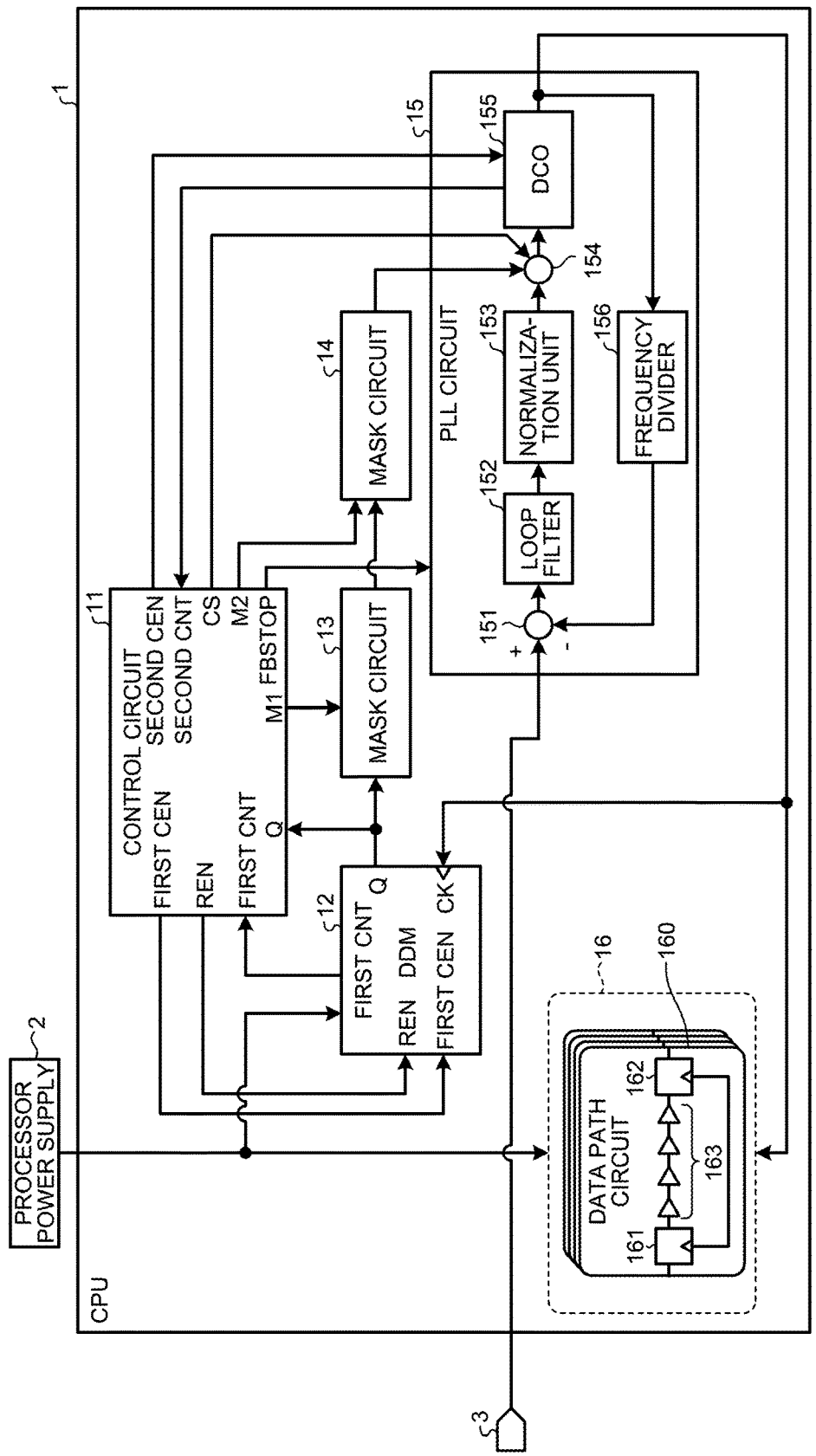
FIG. 1 is a block diagram illustrating a CPU according to a first embodiment.

FIG. 1 is a block diagram illustrating a CPU according to a first embodiment. A CPU 1 includes a control circuit 11, a data delay monitor (DDM) 12, a MASK circuit 13, a MASK circuit 14, a PLL circuit 15, and a logic circuit 16.

The power supply voltage VDD supplied from a processor power supply 2 is supplied to the logic circuit 16. Furthermore, the power supply voltage VDD supplied from the processor power supply 2 is applied to the DDM 12.

The logic circuit 16 includes a plurality of data path circuits 160. Each of the data path circuits 160 includes flip-flops 161 and 162 and a circuit element group 163. Each of the circuit elements in the logic circuit 16 including the data path circuit 160 is driven by using the power supply voltage VDD as the power supply. Furthermore, a clock signal generated by the PLL circuit 15 is applied to the clock input terminals of the flip-flops 161 and 162.

Figure 2:
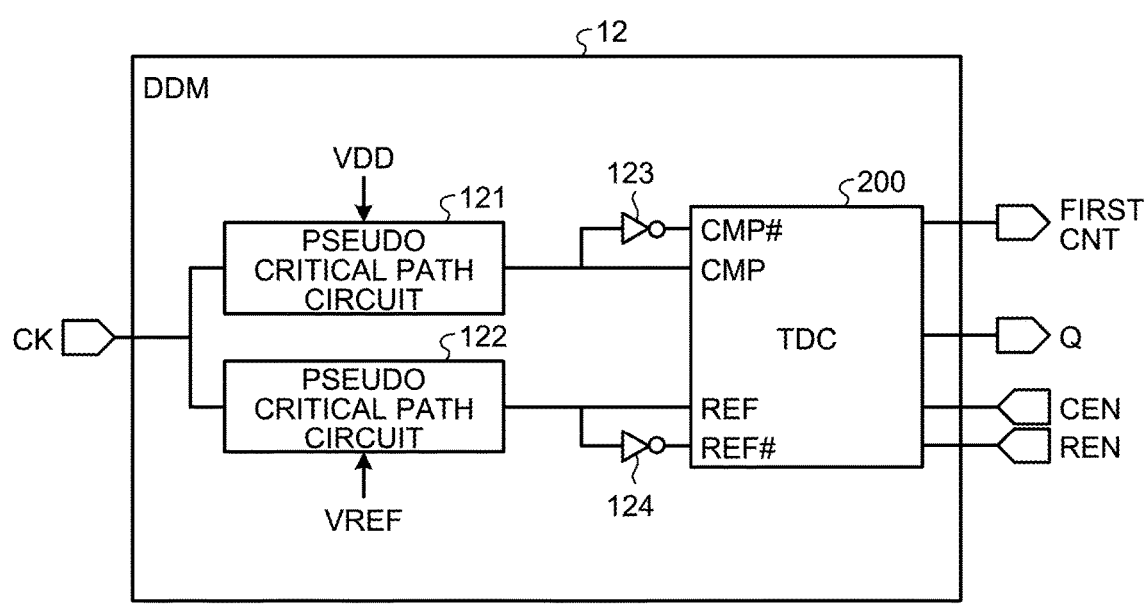
FIG. 2 is a schematic diagram illustrating a DDM.

FIG. 2 is a schematic diagram illustrating the DDM. As illustrated in FIG. 2, the DDM 12 includes pseudo critical path circuits 121 and 122, inverters 123 and 124, and a TDC 200.

The DDM 12 receives an input of a clock (CK) signal that is output from the PLL circuit 15. Furthermore, the DDM 12 receives an input of each of a first counter enable (CEN) signal and a ring oscillator (REN) signal that are output from the control circuit 11.

The clock is the operating frequency of the CPU 1 and, regarding the data path circuit 160, there is a bus through which data is desired to be passed during a single cycle (1 clock) of the clock. The first CEN signal is a signal that operates a counter included in the TDC 200, which will be described later. The REN signal is a signal that allows the circuit in the TDC 200 to function as a ring oscillator.

Figure 3:
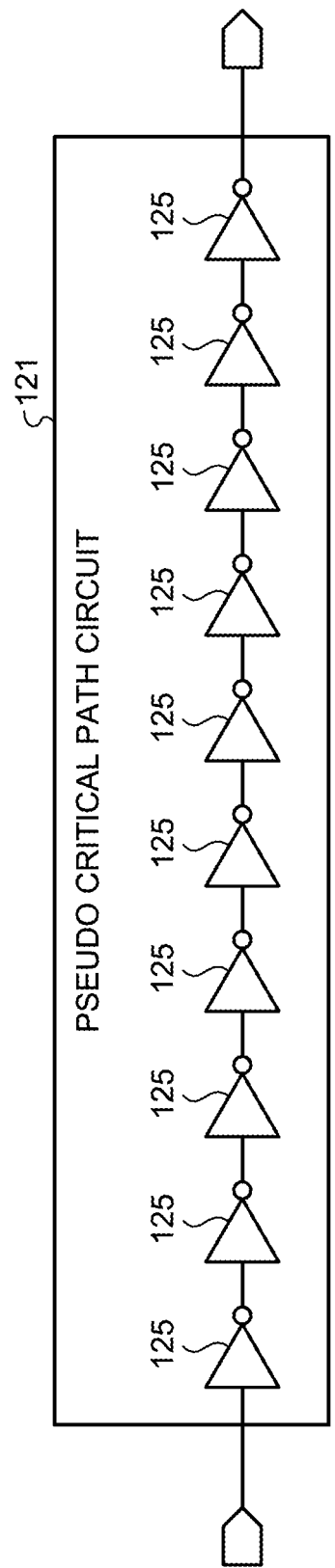
FIG. 3 is a diagram illustrating an example of the configuration of a pseudo critical path circuit.

The pseudo critical path circuits 121 and 122 have the configuration illustrated in, for example, FIG. 3. FIG. 3 is a diagram illustrating an example of the configuration of a pseudo critical path circuit. Because the pseudo critical path circuits 121 and 122 have the same configuration, in FIG. 3, the pseudo critical path circuit 121 is illustrated as an example. As illustrated in FIG. 3, the pseudo critical path circuit 121 is a circuit composed of a plurality of even number of inverters 125 connected in series, thereby implementing desired delay time. The pseudo critical path circuit 121 is designed by reproducing, for example, a signal having a slowest propagation speed in a critical path having a smallest timing margin of the signal propagation in the data path 30.

The power supply voltage VDD supplied from the processor power supply 2 is applied to the pseudo critical path circuit 121. The processor power supply 2 receives a supply from the power supply circuit, such as a direct current (DC)-DC converter on a system board. The pseudo critical path circuit 121 is operated by the power supply voltage VDD used when the data path circuit 160 is actually operated.

The pseudo critical path circuit 121 receives an input of the clock signal that is output from the PLL circuit 15. Then, the pseudo critical path circuit 121 outputs the input clock signal to both the inverter 123 and the TDC 200 after passing the input clock signal through the inverter 125 included in the own pseudo critical path circuit 121.

Because the pseudo critical path circuit 121 is operated by the power supply voltage VDD, regarding the clock signal output from the pseudo critical path circuit 121, the same delay as the delay actually generated in the data path circuit 160 is added to the clock signal. Hereinafter, the clock signal output from the pseudo critical path circuit 121 is referred to as a comparison (CMP: Compare) clock signal. In FIG. 2, the comparison clock signal is referred to as a "CMP".

A reference voltage VREF is applied to the pseudo critical path circuit 122. Here, the reference voltage VREF is a power supply voltage that is supplied from outside in a different manner from the power supply voltage VDD, is the voltage that is not used in a circuit portion other than the DDM 12 illustrated in FIG. 1, and is maintained as a constant voltage without noise nor variations. Namely, the pseudo critical path circuit 122 is operated by a predetermined voltage that is determined at the time of designing.

The pseudo critical path circuit 122 receives an input of the clock signal that is output from the PLL circuit 15. Then, the pseudo critical path circuit 122 outputs the input clock signal to the inverter 124 and the TDC 200 after passing the input clock signal through the inverter 125 included in the own pseudo critical path circuit 122.

Because the pseudo critical path circuit 122 is operated by the reference voltage VREF, regarding the clock signal output from the pseudo critical path circuit 122, the delay in the case where the data path circuit 160 is operated at the voltage desired at the time of design is given to the clock signal. Hereinafter, the clock signal output from the pseudo critical path circuit 122 is referred to as a reference (REF) clock signal. In FIG. 2, the reference clock signal is referred to as a "REF".

The inverter 123 receives an input of the comparison clock signal from the pseudo critical path circuit 121. Then, the inverter 123 outputs, to the TDC 200, an inversion comparison clock signal obtained by inverting the comparison clock signal. In FIG. 2, the inversion comparison clock signal is referred to as a "CMP#".

The inverter 124 receives an input of the reference clock signal from the pseudo critical path circuit 122. Then, the inverter 124 outputs, to the TDC 200, the inversion reference clock signal obtained by inverting the reference clock signal. In FIG. 2, the inversion reference clock signal is referred to as a "REF#".

Figure 4:
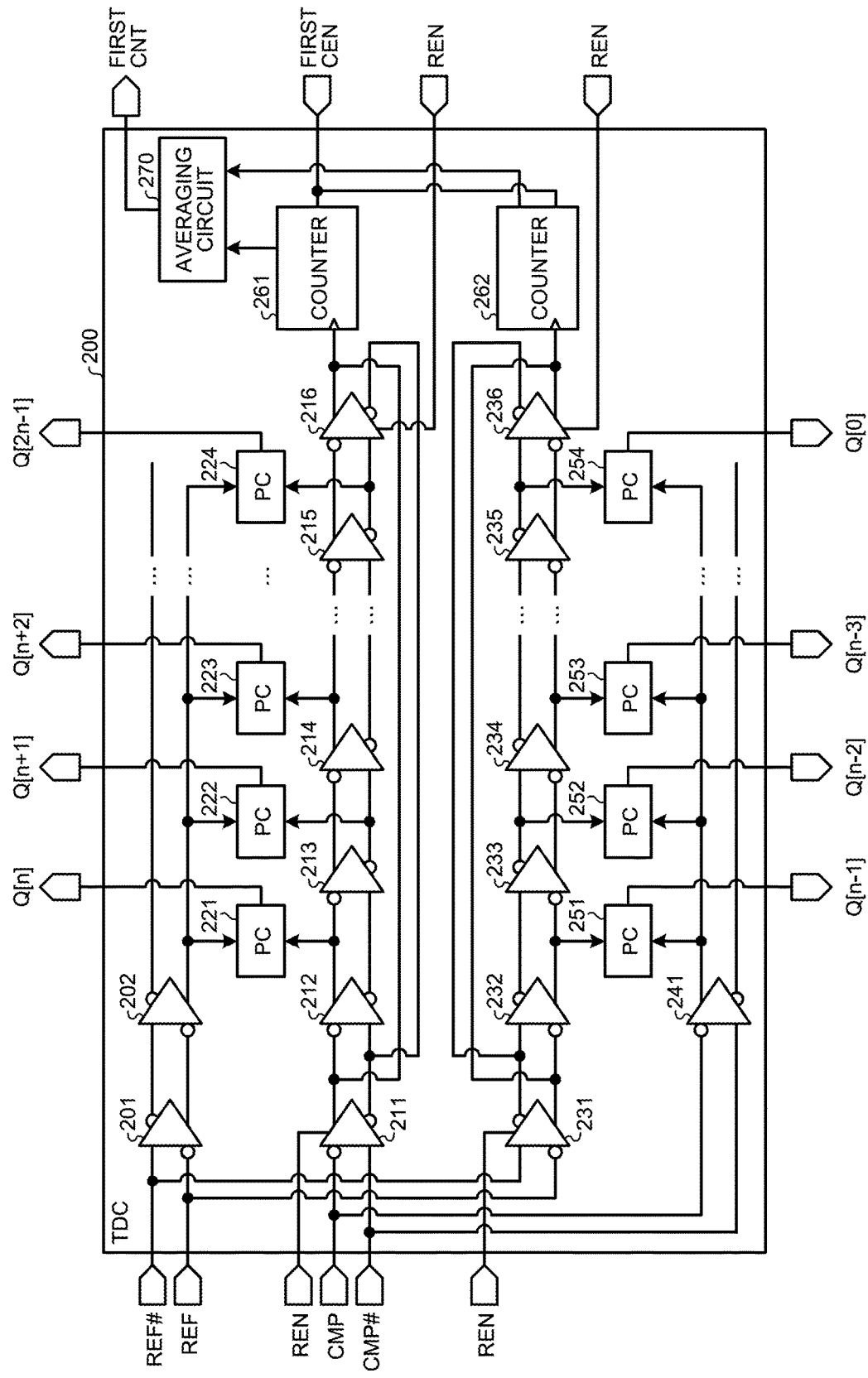
FIG. 4 is a circuit diagram illustrating a TDC in detail.

FIG. 4 is a circuit diagram illustrating a TDC in detail. The TDC 200 mentioned here corresponds to an example of a "voltage variation detection unit". The TDC 200 includes paths to which comparison clock signal and the inversion comparison clock signal that are output from the pseudo critical path circuit 121 are input. The paths to which the comparison clock signal and the inversion comparison clock signal are input are divided into two, one of which passes through a delay circuits 211 to 216, and the other one of which passes through a delay circuit 241.

Furthermore, the TDC 200 includes paths to which the reference clock signal and the inversion reference clock signal that are output from the pseudo critical path circuit 122 are input. The paths to which the reference clock signal and the inversion reference clock signal are input are divided into two, one of which passes through delay circuits 201 and 202, and the other one of which passes through a delay circuits 231 to 236.

The delay circuits 201 and 202 give a predetermined delay to the input reference clock signal and the inversion reference clock signal, inverse the signals, and output the signals. Namely, the delay circuit 202 outputs the reference clock signal and the inversion reference clock signal having the same value as that of the signal output from the pseudo critical path circuit 122.

An even number of the delay circuits 212 to 215 is arranged. Each of the delay circuits 211 to 216 gives a predetermined delay to the input comparison clock signal and the inversion comparison clock signal, inverses the signals, and outputs the signal. Namely, each of the odd numbered circuits from among the delay circuits 211 to 216 from the top outputs the comparison clock signal and the inversion comparison clock signal having the value opposite to that of the input signal. Furthermore, each of the even numbered circuits from among the delay circuits 211 to 216 from the top outputs the comparison clock signal and the inversion comparison clock signal having the same value as that of the input signal. Because the delay circuit 215 is an odd numbered circuit, the delay circuit 215 outputs the comparison clock signal and the inversion comparison clock signal having the value opposite to that of the input signal. Furthermore, because the delay circuit 216 is an even numbered circuit, the delay circuit 216 outputs the comparison clock signal and the inversion comparison clock signal having the same value as that of the input signal.

An even number of the delay circuits 232 to 235 is arranged. Each of the delay circuits 231 to 236 gives a predetermined delay to the input reference clock signal and the inversion reference clock signal, inverses the signals, and outputs the signal. Namely, each of the odd numbered circuits from among the delay circuits 231 to 236 from the top outputs the reference clock signal and the inversion reference clock signal having the value opposite to that of the input signal. Furthermore, each of the even numbered circuits from among the delay circuits 231 to 236 from the top outputs the reference clock signal and the inversion reference clock signal having the same value as that of the input signal. Because the delay circuit 235 is an odd numbered circuit, the delay circuit 235 outputs the reference clock signal and the inversion reference clock signal having the value opposite to that of the input signal. Furthermore, because the delay circuit 236 is an even numbered circuit, the delay circuit 236 outputs the reference clock signal and the inversion reference clock signal having the same value as that of the input signal.

The delay circuit 241 gives a predetermined delay to the input comparison clock signal and the inversion comparison clock signal, inverses the signals, and outputs the signals. Namely, the delay circuit 241 outputs the comparison clock signal and the inversion comparison clock signal having the value opposite to that of the input signal.

Furthermore, each of the delay circuits 211 and 216 receives an input of the REN signal from the control circuit 11. If the REN signal is 0, the delay circuit 211 performs a normal impedance output. In contrast, if the REN signal is 1, the delay circuit 211 performs a high impedance output and then an input of the signal from the delay circuit 211 to the delay circuit 212 is cut off. In contrast, if the REN signal is 0, the delay circuit 216 performs a high impedance output. In this case, the path from the delay circuit 216 to the delay circuit 212 becomes high impedance and thus the transmission of the signal from the delay circuit 216 to the delay circuit 212 is cut off. In contrast, if the REN signal is 1, the signal that is output from the delay circuit 216 is input to the delay circuit 212. Because the delay circuits 212 to 216 are odd number of circuits, the delay circuits 212 to 216 function as the ring oscillators, and oscillate. Namely, the delay circuit 216 outputs the signal having a constant oscillation cycle to a counter 261. Hereinafter, the signal that is output by the delay circuit 216 in the state in which the delay circuits 212 to 216 function as the ring oscillators is referred to as a "first oscillation (OSC) signal".

Furthermore, similarly, each of the delay circuits 231 and 236 also receives an input of the REN signal from the control circuit 11. If the REN signal is 0, the delay circuit 231 performs a normal impedance output. In contrast, if the REN signal is 1, the delay circuit 231 performs a high impedance output and an input of the signal from the delay circuit 231 to the delay circuit 232 is cut off. In contrast, if the REN signal is 0, the delay circuit 236 performs a high impedance output. In this case, the path from the delay circuit 236 to the delay circuit 232 becomes high impedance and thus the transmission of the signal from the delay circuit 236 to the delay circuit 232 is cut off. In contrast, if the REN signal is 1, the signal output from the delay circuit 236 is input to the delay circuit 232. Because the delay circuits 232 to 236 are odd number of circuits, the delay circuits 232 to 236 function as the ring oscillators, and oscillate. Namely, the delay circuit 236 outputs the signal having a constant oscillation cycle to a counter 262. Hereinafter, the signal that is output by the delay circuit 236 in the state in which the delay circuits 232 to 236 function as the ring oscillators is referred to as a "second OSC signal".

The counter 261 receives an input of the first OSC signal from the delay circuit 216 in the state in which the delay circuits 212 to 216 function as the ring oscillators. Furthermore, the counter 261 receives an input of the first CEN signal from the control circuit 11. If the CEN signal is 0, the counter 261 stops the operation. If the CEN signal is 0, the counter 261 performs the count by using the first OSC signal as a clock. Then, if the CEN signal is changed from 0 to 1, the counter 261 outputs the count value to an averaging circuit 270.

The counter 262 receives an input of the second OSC signal from the delay circuit 236 in the state in which the delay circuits 232 to 236 function as the ring oscillators. Furthermore, the counter 262 receives an input of the first CEN signal from the control circuit 11. If the CEN signal is 0, the counter 262 stops the operation. If the CEN signal is 0, the counter 262 performs the count by using the second OSC signal as a clock. Then, if the CEN signal is changed from 0 to 1, the counter 262 outputs the count value to the averaging circuit 270.

Figure 5:
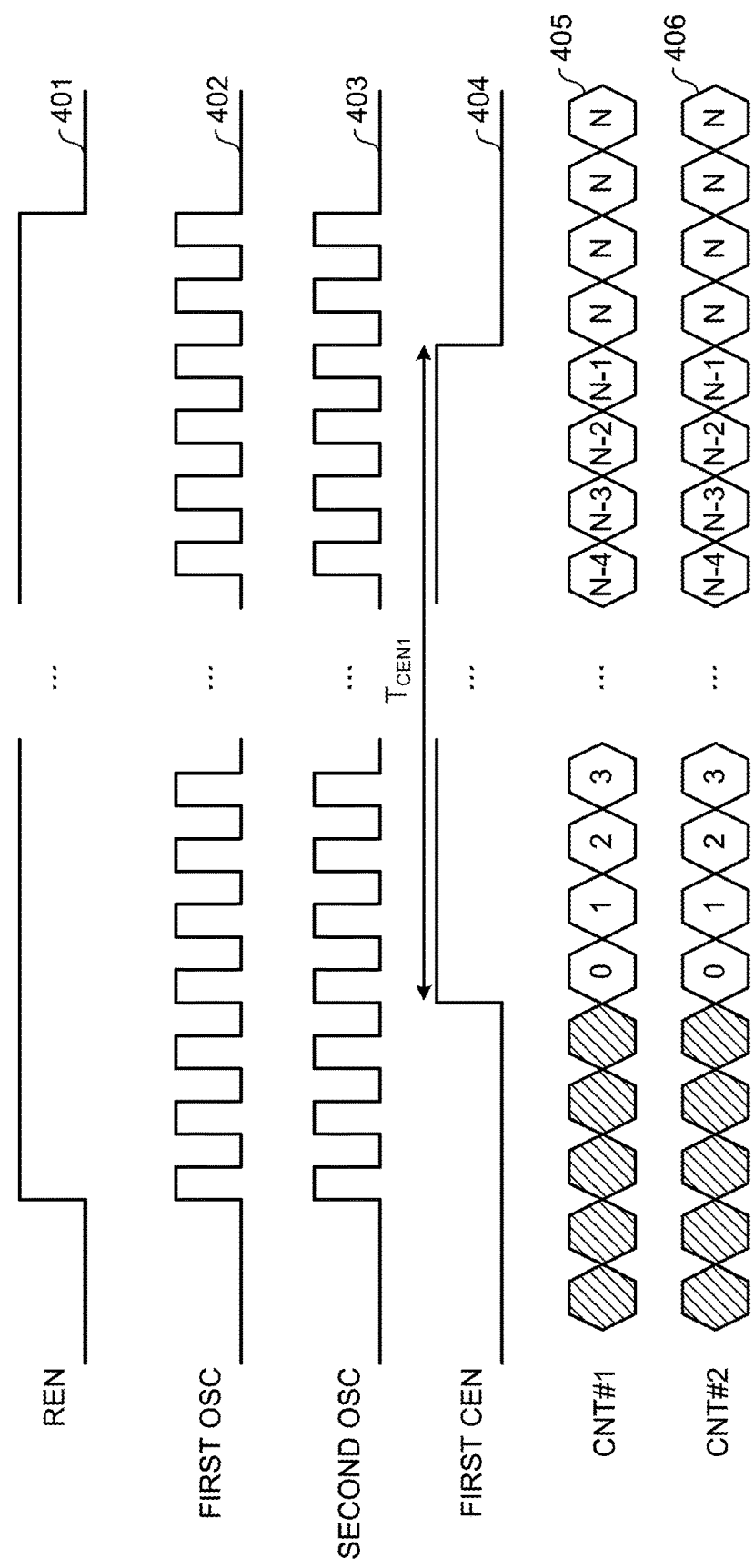
FIG. 5 is a timing diagram illustrating a count of oscillation signals in the TDC.

FIG. 5 is a timing diagram illustrating a count of oscillation signals in the TDC. A graph 401 is the graph indicating the REN signal. A graph 402 is the graph indicating the first OSC signal. A graph 403 is the graph indicating the second OSC signal. A graph 404 is a graph indicating the first CEN signal. A graph 405 is a graph indicating a count (CNT) #1 that is a count value of the counter 261. A graph 406 is a graph indicating a CNT #2 that is a count value of the counter 262.

During the period of time in which the REN signal is High indicated by graph 401, as indicated by the graph 402, the delay circuit 216 outputs the first OSC signal and, as indicated by the graph 403, the delay circuit 236 outputs the second OSC signal. Then, after an output of each of the first OSC signal and the second OSC signal is started, as indicated by the graph 404, the first CEN signal becomes High and the counters 261 and 262 start the count. Then, after elapse of a period of time $T_{CEN1}$, the first CEN signal is changed to Low and the counters 261 and 262 stop the count and maintain the value of the CNT#1 and the CNT#2 at that time. In this case, the graphs 405 and 406 indicate that the counters 261 and 262, respectively, count N clocks during the period of time $T_{CEN1}$.

A description will be continued by referring back to FIG. 4. The averaging circuit 270 receives an input of the count value from the counter 261. Furthermore, the averaging circuit 270 receives an input of the count value from the counter 262. Then, the averaging circuit 270 calculates the average of each of the count values and outputs the calculated value as the first count value to the control circuit 11. In FIG. 4, the count value output by the averaging circuit 270 is represented by the first CNT.

Phase comparators (PCs: comparator circuits) 221 to 224 receive an input of the reference clock signal having the same value as that of the signal output from the pseudo critical path circuit 122. Furthermore, the odd numbered circuits from the top from among the PCs 221 to 224 receives, from the odd numbered circuits from among the delay circuits 212 to 215, respectively, an input of the comparison clock signal having the same value as that of the signal output from the pseudo critical path circuit 121. Furthermore, the even numbered circuits from the top from among the PCs 221 to 224 receives, from the even numbered circuits from among the delay circuits 212 to 215, respectively, an input of the inversion comparison clock signal having a value opposite to that of the signal output from the inverter 123.

The odd numbered circuits from the top from among the PCs 221 to 224 compare the rising phase of the comparison clock signal with that of the reference clock signal; output 1, if the comparison clock is advanced; and output 0, if the comparison clock is delayed. Furthermore, the even numbered circuits from the top from among the PCs 221 to 224 compare the rising phase of the reference clock signal with that of the inverted comparison reference clock signal; output 1, if the comparison clock is advance; and output 0, if the comparison clock is delayed. Namely, if the comparison clock signal indicates the same as the reference clock signal or is advanced, all of the PCs 221 to 224 output 0. Furthermore, if the comparison clock signal is delayed with respect to the reference clock signal, the circuit and the subsequent circuits in each of which the delay having the same timing in the PCs 221 to 224 is given to the comparison clock signal or the inversion comparison clock signal output 0 and the circuits previous to the subject circuits output 1. Namely, the PCs 221 to 224 output 1 by an amount corresponding to an amount in which the comparison clock signal is advanced with respect to the reference clock signal.

For example, if a delay difference between the comparison clock signal and the reference clock corresponds to the range between two delay circuits and three delay circuits from among the delay circuits 212 to 215, the PCs 221 and 222 output 1 and the PCs 223 and 224 output 0. In this way, the number of 1 indicates an amount of delay of the comparison clock signal with respect to the reference clock signal. If a circuit delay of the pseudo critical path circuit 121 is shorter than the circuit delay of the pseudo critical path circuit 122, the comparison clock signal is advanced with respect to the reference clock signal. Thus, the number of 1 that is output by the PCs 221 to 224 indicates how long the circuit delay of the pseudo critical path circuit 121 is shorter compared with the circuit delay of the pseudo critical path circuit 122.

Each of a PCs 251 to 254 receives an input of the comparison clock signal having the value opposite to the signal output from the pseudo critical path circuit 121. Furthermore, each of the odd numbered circuits from the top from among the PCs 251 to 254 receives, from the odd numbered circuits from among the delay circuits 232 to 235, an input of the reference clock signal having the same value as that of the signal output from the pseudo critical path circuit 122. Furthermore, each of the even numbered circuits from the top from among the PCs 251 to 254 receives, from the even numbered circuits from among the delay circuits 232 to 235, an input of the inversion reference clock signal having the value opposite to that of the signal output from the inverter 124.

The odd numbered circuits from the top from among the PCs 251 to 254 compare the rising phase of the reference clock signal with that of the comparison clock signal; outputs 1, if the comparison clock is delayed; and outputs 0, if the comparison clock is advanced. Furthermore, the even numbered circuits from the top from among the PCs 251 to 254 compare the rising phase of the inverted inversion reference clock signal with that of the inverted comparison clock signal; output 1, if the comparison clock is delayed; and output 0, if the comparison clock is advanced. Namely, if the phase of the comparison clock signal is the same as that of the reference clock or is advanced, all of the PCs 251 to 254 output 1. Furthermore, if the phase of the comparison clock signal is advanced with respect to the phase of the reference clock signal, the circuit and the subsequent circuits, in each of which the delay having the same timing in the PCs 251 to 254 is given to the reference clock signal or the inversion reference clock signal, output 0 and the circuits previous to the subject circuits output 1. Namely, the PCs 251 to 254 output 1 by an amount corresponding to an amount in which the comparison clock signal is delayed with respect to the reference clock signal.

For example, if a delay difference between the comparison clock signal and the reference clock signal corresponds to the range between two circuits and three delay circuits from among the delay circuits 232 to 235, the PCs 251 and 252 output 1 and the PCs 253 and 254 output 0. In this way, the number of 0 indicates an amount of delay of the comparison clock with respect to the reference clock. If a circuit delay of the pseudo critical path circuit 121 is longer than the circuit delay of the pseudo critical path circuit 122, the comparison clock signal is delayed with respect to the reference clock signal. Thus, the number of 0 that is output by the PCs 251 to 254 indicates how long the circuit delay of the pseudo critical path circuit 121 is longer compared with the circuit delay of the pseudo critical path circuit 122.

The TDC 200 outputs, to the MASK circuit 13 and the control circuit 11, the signal, as a circuit delay measurement value Q, in which the pieces of data that are output from the PCs 221 to 224 are sequentially arranged and set as the low order bits and the pieces of data that are output from the PCs 251 to 254 are sequentially arranged and set as the high order bits. For example, if the number of the PCs 221 to 224 is n and if the number of the PCs 251 to 254 is n, the TDC 200 outputs 2n-bit circuit delay measurement values Q. In this case, if 2n-bit circuit delay measurement values Q are represented by Q[2n-1:0], Q[2n-1:n] has the values obtained by sequentially arranging the pieces of the data that are output from the PCs 221 to 224 and Q[n-1:0] has the values obtained by sequentially arranging the pieces of the data that are output from the PCs 251 to 254. In FIG. 4, in association with the position of bits of Q[2n-1:0], the pieces of the data that are output from the PCs 221 to 224 are indicated by Q[n] to [2n-1], respectively, and the pieces of the data that are output from the PCs 251 to 254 are indicated by Q[n-1] to [0], respectively.

If the circuit delay of the pseudo critical path circuit 121 is the same as the circuit delay of the pseudo critical path circuit 122, the high order n bits of Q[2n-1:0] become 0 and the low order n bits become 1. Q[2n-1:0] having these values is represented by {n'b00 . . . 00, n'b11 . . . 11}={n(1'b0), n(1'b)}. If n is, for example, 8 and the circuit delay of the pseudo critical path circuit 122 is the same, Q [16:0] becomes "0000000011111111". Furthermore, if the comparison clock signal is delayed with respect to the reference signal by a delay difference corresponding to the range between two times and three times longer than a predetermined delay, Q[16:0] becomes "0000000000111111". In contrast, if the comparison clock signal is advanced with respect to the reference signal by a delay difference corresponding to the range between two times and three times longer than the predetermined delay, Q[16:0] becomes "0000001111111111".

A description will be continued by referring back to FIG. 1. The MASK circuits 13 and 14 are the circuits that are used to fix predetermined bits of the circuit delay measurement value Q output from the DDM 12 to a specific value. In the following, the MASK circuits 13 and 14 will be described in detail with reference to FIGS. 6 and 7.

Figure 6:
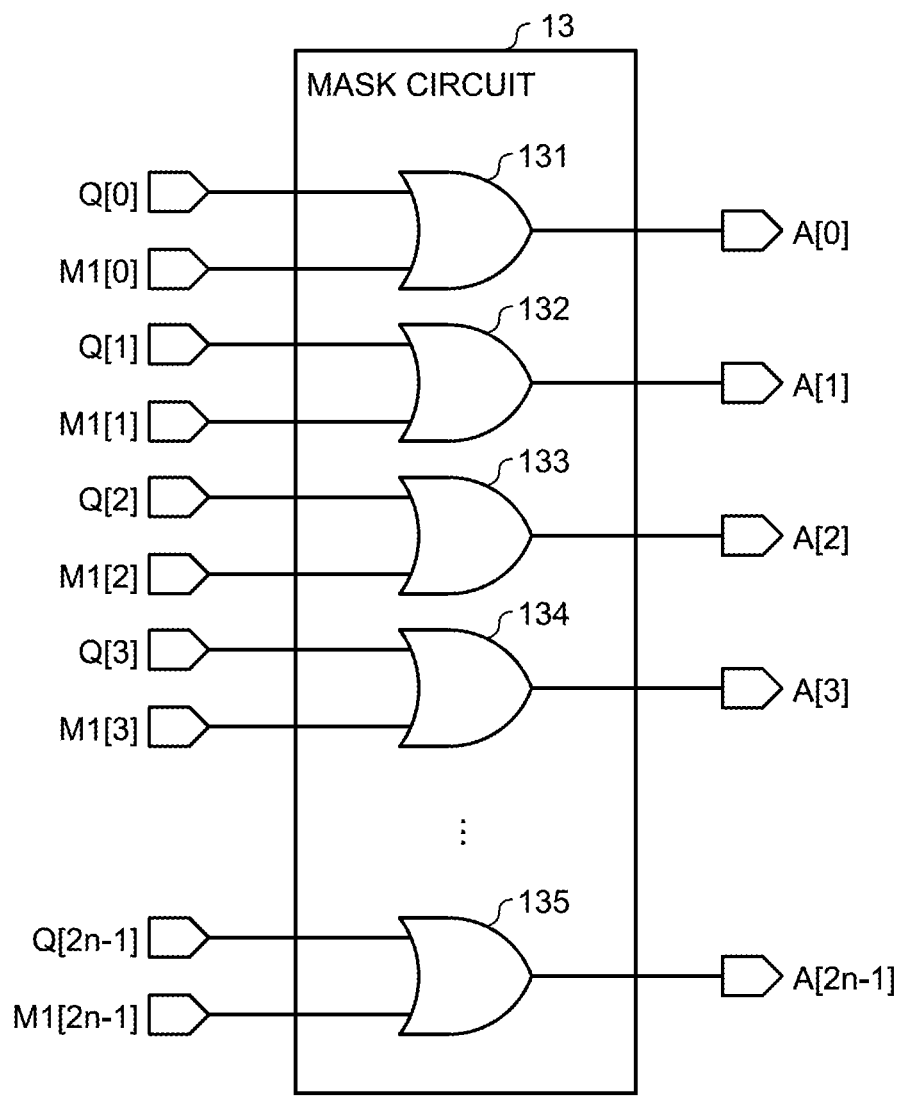
FIG. 6 is a diagram illustrating an example of a MASK circuit 13.

FIG. 6 is a diagram illustrating an example of a MASK circuit 13. The MASK circuit 13 includes OR circuits 131 to 135. The number of the OR circuits 131 to 135 arranged is the same as the number of bits of the circuit delay measurement value Q output by the TDC 200. Then, in each of the OR circuits 131 to 135, the value of each bit of the circuit delay measurement value Q is input. Namely, if the number of the PCs 221 to 224 and 251 to 254 used is n, the number of the OR circuits 131 to 135 is 2n and the circuit delay measurement values Q[0] to [2n-1] are input to the OR circuits 131 to 135, respectively.

Furthermore, each of the OR circuits 131 to 135 receives an input of a 1-bit first mask signal from the control circuit 11. Here, a description will be given of a case in which the number of the OR circuits 131 to 135 is 2n. Furthermore, the values of the first mask signal input to the OR circuits 131 to 135 are M1[0] to [2n-1], respectively. Here, the signal collectively representing the first mask signals M1[0] to [2n-1] is referred to as a first mask signal M1 and, if each of the bits is represented, this is referred to as M1[2n-1:0].

The OR circuits 131 to 135 output, to the MASK circuit 14, the logical addition of the circuit delay measurement value Q and the first mask signal M1. Here, the values output from each of the OR circuits 131 to 135 are represented by A[0] to [2n-1], respectively. If the value of the first mask signal M1 is 1, the value output from each of the OR circuits 131 to 135 is fixed to 1. In contrast, if the value of the first mask signal M1 is 0, the value output from each of the OR circuits 131 to 135 becomes the value of the fixed delay measurement value. Namely, regarding each of the bits of the circuit delay measurement values Q, if the value of the corresponding the first mask signal M1 is 1, the MASK circuit 13 masks such that the value is fixed to 1.

Figure 7:
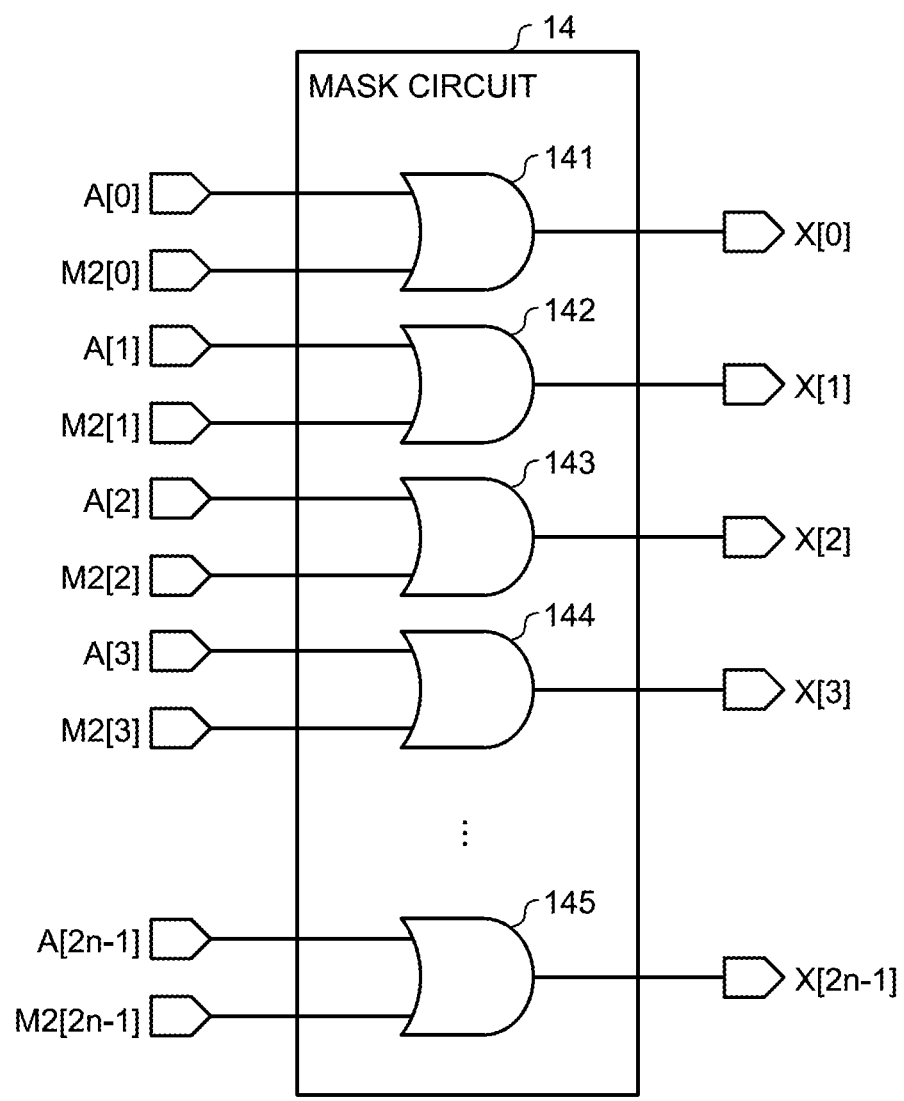
FIG. 7 is a diagram illustrating an example of a MASK circuit 14.

FIG. 7 is a diagram illustrating an example of a MASK circuit 14. The MASK circuit 14 includes AND circuits 141 to 145. The same number of the AND circuits 141 to 145 as the number of the OR circuits 131 to 135 in the MASK circuit 13 is arranged. Then, in each of the AND circuits 141 to 145, the signal output from each of the OR circuits 131 to 135 in the MASK circuit 13 is input. Namely, if the number of the PCs 221 to 224 and 251 to 254 used is n, the number of the AND circuits 141 to 145 is 2n and the values A[0] to [2n-1] are input to each of the AND circuits 141 to 145.

Furthermore, the AND circuits 141 to 145 receives an input of a 1-bit second mask signal from the control circuit 11. Here, a description will be given of a case in which the number of the AND circuits 141 to 145 is 2n. Furthermore, the values of the second mask signal input to the AND circuits 141 to 145 are M2[0] to [2n-1], respectively. Here, the signal collectively representing M2[0] to [2n-1] is referred to as a second mask signal M2 and, if each of the bits is represented, this is referred to as M2 [2n-1:0].

The AND circuits 141 to 145 output, to the PLL circuit 15, the logical multiplication of the signal output from the OR circuits 131 to 135 and the second mask signal M2. Here, the values output from each of the AND circuits 141 to 145 are represented by X[0] to [2n-1], respectively. If the value of the second mask signal M2 is 0, the value output from each of the AND circuits 141 to 145 is fixed to 0. In contrast, if the value of the second mask signal M2 is 1, the value output from each of the AND circuits 141 to 145 becomes the value of the signal output from the OR circuits 131 to 135. Namely, regarding the signal output from each of the OR circuits 131 to 135, if the value of the corresponding second mask signal M2 is 0, the MASK circuit 13 masks such that the value is fixed to 0.

A description will be continued by referring to FIG. 1. The PLL circuit 15 includes a phase comparator 151, a loop filter 152, a normalization unit 153, an adder 154, a digitally controlled oscillator (DCO) 155, and a frequency divider 156.

The phase comparator 151 receives an input of the reference signal that is output from the external clock generating device 3. Furthermore, the phase comparator 151 receives an input of the divided signal that is output from the frequency divider 156, which will be described later. Then, the phase comparator 151 generates a phase detection signal that is in accordance with the phase difference between the divided signal and the reference signal. If the phase of the divided signal slower than the phase of the reference signal, the phase detection signal may become, for example, a negative value (or, a value smaller than a predetermined reference value) and, if the phase of the divided signal is faster than the phase of the reference signal, the phase detection signal may become, for example, a positive value (or, a value greater than the predetermined reference value). Furthermore, the magnitude of the value of the phase detection signal (or, the magnitude of the difference from the predetermined reference value) may become the value that is in accordance with the difference between the phase of the divided signal and the phase of the reference signal. The phase detection signal may be a digital code represented by a plurality of bits each having a value of, for example, 0 or 1.

The loop filter 152 is a low-pass filter that passes low-frequency components of the phase detection signal output from the phase comparator 151 and that cuts off or attenuates high-frequency components and may be implemented by, for example, a digital filter. By performing low-pass filter processing on the phase detection signal output from the phase comparator 151, the loop filter 152 generates phase difference information that indicates a tendency of the phase difference over a certain long period of time without being affected by temporary minute variations and supplies the generated phase difference information to the normalization unit 153. The phase difference information may be a digital code represented by a plurality of bits each having a value of, for example, 0 or 1.

The normalization unit 153 receives an input of the phase difference information from the loop filter 152. By multiplying a predetermined coefficient by the supplied phase difference information, the normalization unit 153 generates a phase difference code having an appropriate value as an input signal of the DCO 155. In the DCO 155, the magnitude (sensitivity) of a change in the oscillation frequency with respect to a change in 1 bit of the least significant bit (LSB) in the input signal varies in accordance with the oscillation frequency. The normalization unit 153 can eliminate the effect of frequency dependence of the sensitivities of the DCO 155 by multiplying the phase difference information by the coefficient that cancels the difference of the sensitivities in accordance with the oscillation frequency of the DCO 155. If the frequency dependence of the sensitivities of the DCO 155 can be ignored, the normalization unit 153 does not need to be provided. The phase difference code generated by the normalization unit 153 is supplied to the adder 154. The phase difference code may be a digital code represented by a plurality of bits each having a value of, for example, 0 or 1.

The adder 154 receives, from the normalization unit 153, an input of the phase difference code that is the signal in accordance with the phase difference between the divided signal and the reference signal. Furthermore, the adder 154 acquires, as a detection signal from the MASK circuit 14, the signal obtained by the MASK circuits 13 and 14 masking the circuit delay measurement value Q. The detection signal is the signal obtained by masking the circuit delay measurement value Q and has the same number of bits; therefore, hereinafter, similarly to the circuit delay measurement value Q, the detection signal is represented by Q[2n-1:0] and each of the bits thereof are represented by Q[0] to [2n-1].

Furthermore, the adder 154 receives, from the control circuit 11, an input of a control signal CS that is used to adjust the number of driving gates to set to ON. The number of control signals CS is present by the same number of, for example, bits in the detection signal. For example, if the detection signal is 2n bits, the adder 154 receives an input of 2n control signals CS. Furthermore, the number of bits in the control signal CS is the value equal to or less than the number of driving gates that are included in the DCO 155 and that can be set to ON or OFF when the number of subject bits is multiplied by the number of bits in the detection signal. Hereinafter, the control signals CS in the case where the number of bits of the control signal CS is h and the number of bits in the detection signal is 2n are referred to as control signals $CS_0[h-1:0]$ to $CS_{2n-1}[h-1:0]$.

Then, the adder 154 generates combinations by associating the detection signals Q[0] to [2n-1] with the control signals $CS_0[h-1:0]$ to $CS_{2n-1}[h-1:0]$, respectively. Furthermore, the adder 154 supplies, as an input signal to the DCO 155, the signal of the generated combination of the detection signal and the control signal and the phase code. The signal that is added to the phase difference code by the adder 154 may also be the detection signal itself that is an output of the MASK circuit 14 or may also be a normalized signal that is a constant multiple of the detection signal so as to become an appropriate size as an input of the DCO 155.

The DCO 155 receives an input of the signal that is a combination of the detection signal Q and the control signal CS from the adder 154. Then, the DCO 155 generates an oscillation signal having a cycle (or frequency) that is in accordance with the input signal. The oscillation signal oscillated by the DCO 155 is supplied to the frequency divider 156. The DCO 155 mentioned here corresponds to an example of an "oscillator".

The oscillation signal oscillated by the DCO 155 is supplied to the logic circuit 16 as a clock signal. For example, if a value of the input signal input to the DCO 155 is increased, the length of the cycle of the oscillation signal in the DCO 155 is increased. In contrast, if the value of the input signal of the DCO 155 is decreased, the length of the cycle of the oscillation signal in the DCO 155 is decreased. In this case, if the power supply voltage VDD drops, the value of the detection signal Q that uses the circuit delay measurement value Q and that is the output signal of the DDM 12 is increased. In contrast, if the power supply voltage VDD is increased, the value of the detection signal that is input from the MASK circuit 14 using the circuit delay measurement value Q and that is the output signal of the DDM 12 is decreased. If the relation between the variation in the value of the input signal of the DCO 155 and variation in the length of the cycle of the oscillation signal of the DCO 155 is opposite to the description above, the value of the detection signal that is input from the MASK circuit 14 may be increased in response to a drop of the power supply voltage VDD.

However, if synchronization of the clocks in the PLL circuit 15 has been completed, in the DCO 155, the adaptive frequency control is temporarily stopped by the control circuit 11. Then, the control circuit 11 determines a control signal CS that adjusts the number of driving gates that are set to ON in order to match the measurement time resolution of the TDC 200 with the cycle modulation time resolution of the DCO 155. This control signal CS is the control signal that changes the number of driving gates to be driven. Thereafter, the determined control signal CS is output from the control circuit 11 and the DCO 155 performs adaptive frequency control by using the subject control signal CS, generates the oscillation signal having the number of cycles that is in accordance with the input signal, and then outputs the signal.

Figure 8:
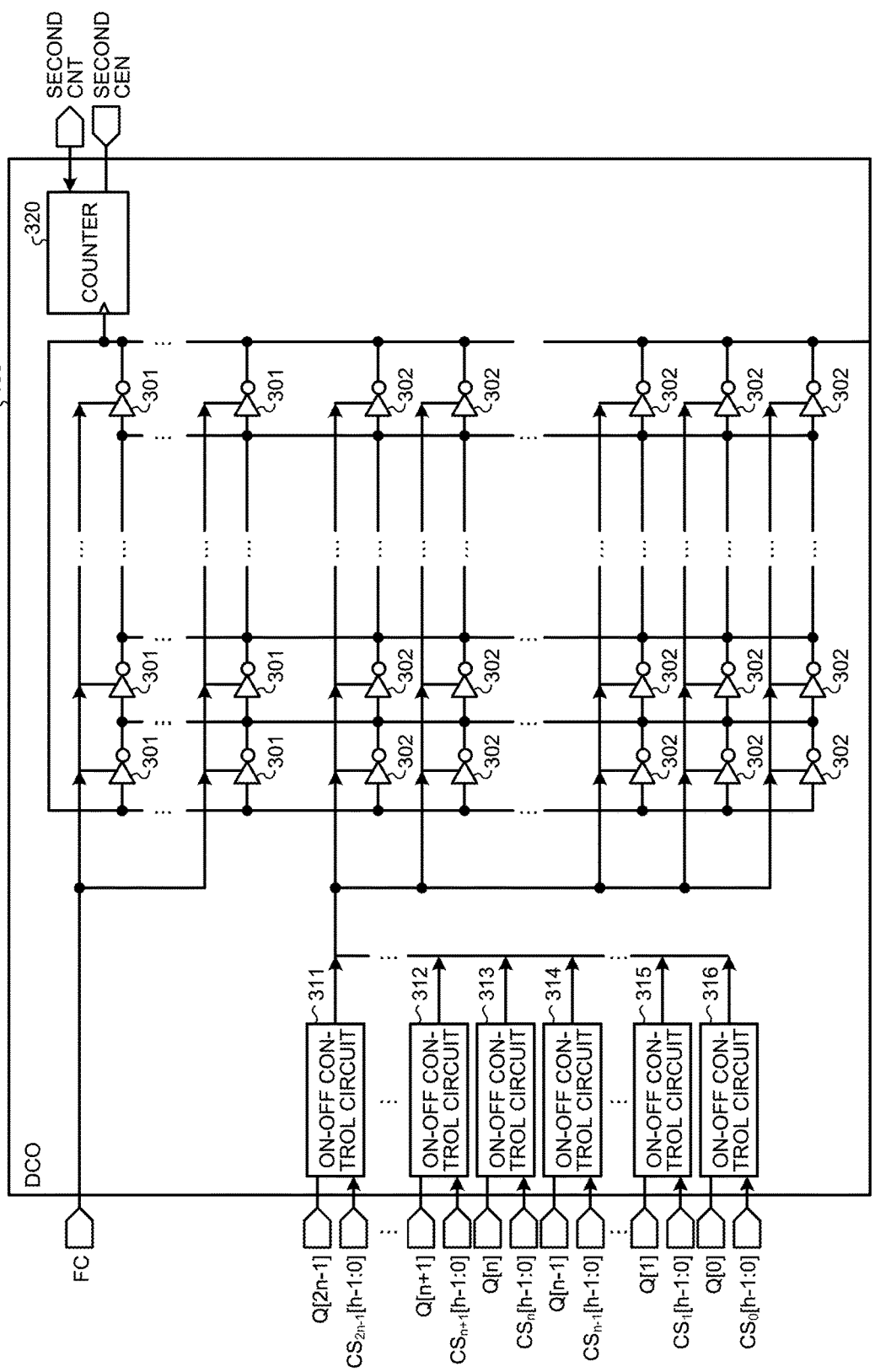
FIG. 8 is a circuit diagram illustrating a DCO in detail.

In the following, processing of ON and OFF the driving gates of the DCO 155 will be described in detail with reference to FIG. 8. FIG. 8 is a circuit diagram illustrating a DCO in detail.

The DCO 155 includes driving gates 301 and 302 constituting an oscillator. The driving gates 301 to which the signal FC having a value of 1 is input and are always in an ON state. In contrast, in the driving gate 302, the value of the input signal is 1 or 0 and, if the value of the signal is 1, the driving gate 302 is in an ON state and, if the value of the signal is 0, the driving gate 302 is in an OFF state. Namely, the driving gates 301 are always used as the oscillators; however, some of the driving gates 302 are not used for the oscillators and thus the oscillation frequency is adjusted depending of the number of the driving gates 302.

Furthermore, the DCO 155 includes on-off control circuits 311 to 316. The same number of the on-off control circuits 311 to 316 as the number of bits in the detection signal is arranged. For example, if the number of bits in the detection signal is 2n bits, the number of the on-off control circuits 311 to 316 to be arranged is 2n.

Each of 2n number of the on-off control circuits 311 to 316 receives an input of Q[0] to [2n-1] that are the values of respective bits in the detection signals. Furthermore, the on-off control circuits 311 to 316 receives an input of the control signals $CS_0[h-1:0]$ to $CS_{2n-1}[1:0]$ associated with the bits in the input detection signals. In the following, a description will be given by representing the on-off control circuits 311 to 316 as an "on-off circuit 310" without distinguishing the on-off control circuits 311 to 316 and the two input signals are the detection signal Q and the control signal CS[h-1:0]. The detection signal Q is one of Q[0] to [2n-1]. Furthermore, the control signal CS[h-1:0] is one of $CS_0[h-1:0]$ to $CS_{2n-1}[h-1:0]$.

Figure 9:
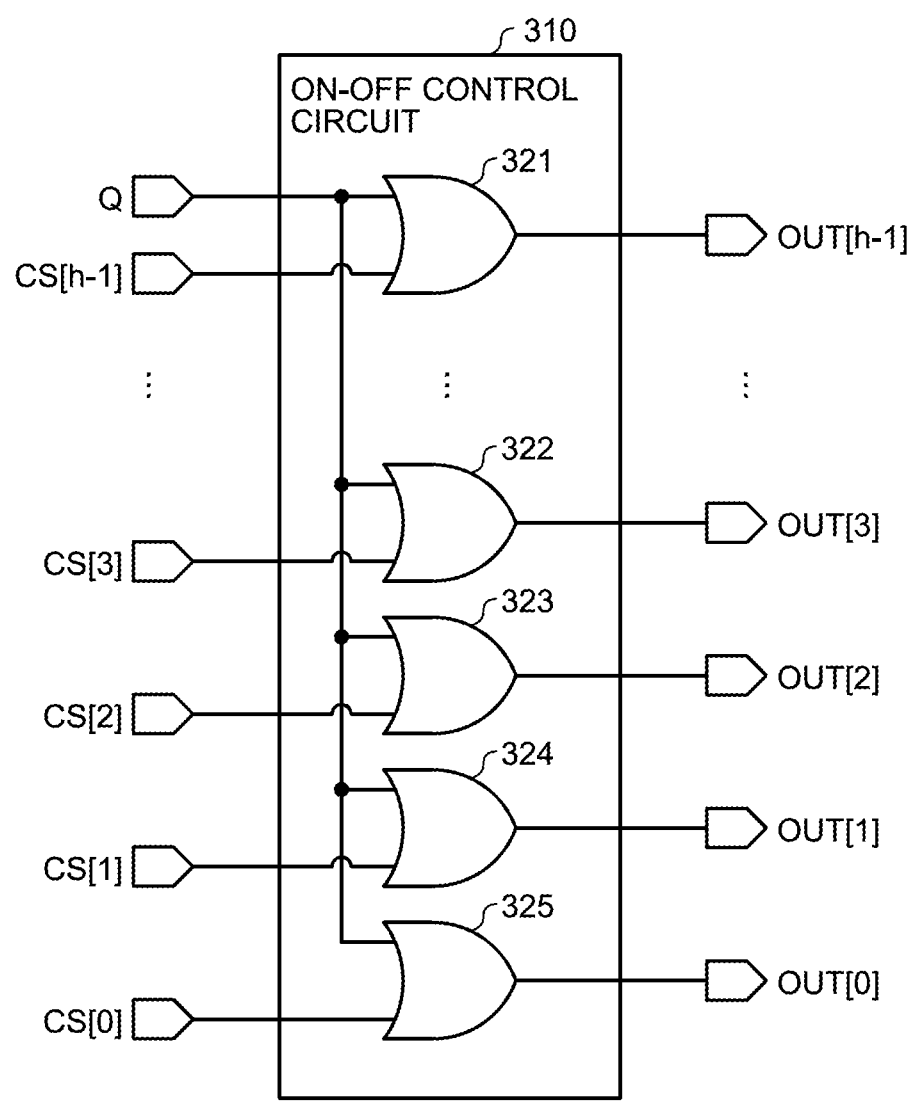
FIG. 9 is a circuit diagram illustrating an on-off circuit.

FIG. 9 is a circuit diagram illustrating an on-off circuit. The on-off circuit 310 includes OR circuits 321 to 325. The same number of OR circuits 321 to 325 as the number of bits in the control signal CS is arranged. Here, a description will be given of a case in which the number of bits in the control signal CS is h. Each of the OR circuits 321 to 325 receives an input of the detection signal Q. Furthermore, each of the OR circuits 321 to 325 receives an input of the control signals CS[0] to CS[h-1] that are the values of the bits in the control signals CS[h-1:0]. Then, each of the OR circuits 321 to 325 obtains the logical addition of the input signal and outputs the calculation result. Here, the signals that are output from the OR circuits 321 to 325 are represented by OUT[0] to OUT[h-1], respectively.

If the value of the bit of the circuit delay measurement value Q is 1, the OR circuits 321 to 325 output the signal with the value of 1 regardless of the values of the control signals CS[0] to CS[h-1]. In contrast, if the value of the bit of the circuit delay measurement value Q is 0, the OR circuits 321 to 325 output 0 in the case where the values of the control signals CS[0] to CS[h-1] are 0 and output 1 in the case where the values of the control signals CS[0] to CS[h-1] are 1. Then, the driving gates 302, the number of which corresponds to the number of signals each having the value of 1 output from the on-off control circuits 311 to 316, are turned on and the driving gates 302, the number of which corresponds to the number of signals each having the value of 0 output from the on-off control circuits 311 to 316, are turned off.

A counter 320 receives an input of the second CEN signal from the control circuit 11. If the value of the second CEN signal is 0, the counter 320 stops the count. Then, if the value of the second CEN signal is changed from 0 to 1, the counter 320 is temporarily reset to 0. Then, the counter 320 counts, as a clock, the oscillation signal that is output from the oscillator formed by the driving gates 301 and 302. Thereafter, if the value of the second CEN signal is changed from 1 to 0, the counter 320 stops the count, holds the count value at that time, and outputs the value as the second CNT to the control circuit 11.

Figure 10:
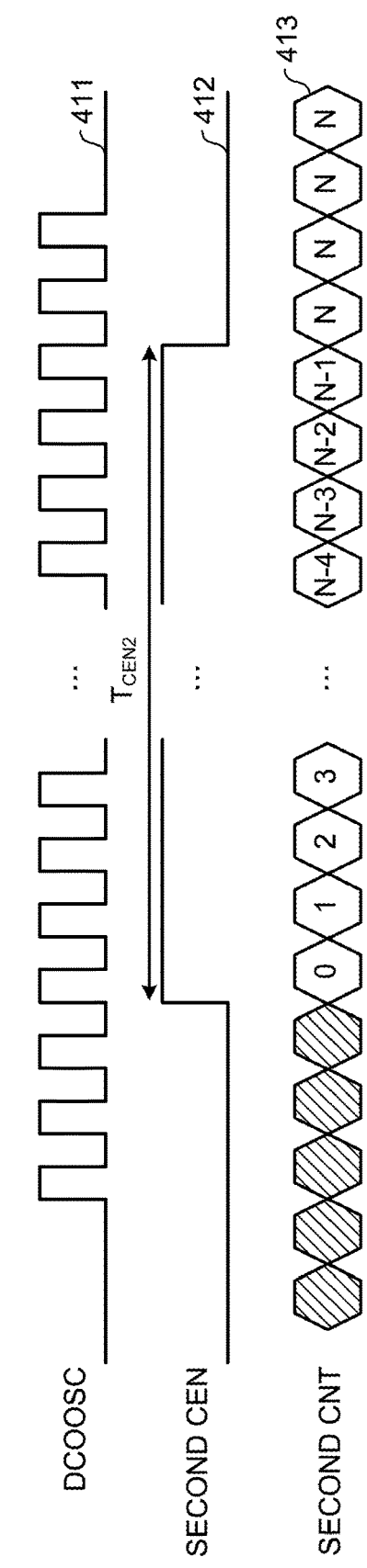
FIG. 10 is a timing diagram illustrating a count of an oscillation signal in the DCO.

FIG. 10 is a timing diagram illustrating a count of an oscillation signal in the DCO. A graph 411 is a graph indicating a DCOOSC signal that is an oscillation signal output from the oscillator formed by the driving gates 301 and 302. A graph 412 is a graph indicating the second CEN signal. A graph 413 is a graph indicating the second CNT that is the count value of the counter 320.

As indicated by the graph 411, the oscillator formed by the driving gates 301 and 302 outputs the DCOOSC signal that is the oscillation signal. If the value of the first CEN signal input from the control circuit 11 is 0, the counter 320 does not perform a count. Namely, in the portion in which the value of the second CEN in the graph 412 is 0 and that is previous to the portion in which the value of the second CEN becomes 1, as indicated by the graph 413, the second CNT that is the count value of the counter 320 is undefined. Then, if the value of the second CEN that is input from the control circuit 11 is changed from 0 to 1, the counter 320 resets the count value and then starts the count. Namely, at the timing in which the value of the second CEN in the graph 412 is changed from 0 to 1, as indicated by the graph 413, the counter 320 starts the count. Then, if the value of the second CEN that is input from the control circuit 11 is changed from 1 to 0, the counter 320 stops the count and holds the count value at that time as the second CNT. In FIG. 10, the value of the second CEN is 1 in the period of time $T_{CEN2}$. Namely, as indicated by the graph 412, the value of the second CEN becomes 1 and is then changed to 0 in the period of time $T_{CEN2}$. Then, at the timing in which the value of the second CEN is changed from 1 to 0, as indicated by the graph 413, the counter 320 stops the count and then holds the count value at that timing as the second CNT. In FIG. 10, the counter 320 holds N as the second CEN.

A description will be continued by referring back to FIG. 1. The frequency divider 156 divides the oscillation signal by the frequency dividing rate in accordance with the frequency dividing rate set code (i.e., the frequency dividing rate in accordance with the detection signal Q) and generates a divided signal. The frequency divider 156 outputs the generated divided signal to the phase comparator 151.

In the following, the control circuit 11 will be described. The control circuit 11 may also be implemented by, for example, a microcomputer, or the like. The control circuit 11 stores various kinds of programs including the program for implementing the processing described below in a memory, or the like and implements the function described below by reading and executing these various kinds of programs. In the following, a description will be given of a case in which the number of the PCs 221 to 224 and the PCs 251 to 254 present is n, i.e., a case in which the circuit delay measurement value Q is 2n bits.

The control circuit 11 waits until the CPU 1 starts its operation and synchronization of the clocks in the PLL circuit 15 is completed. For example, the control circuit 11 may also store therein the period sufficient to complete the synchronization of the clocks in the PLL circuit 15 and may also wait during the period after the CPU 1 has started its operation.

Then, the control circuit 11 outputs the signal (M1={2n (1'b1)}) in which all of the 2n bits are 1 to the MASK circuit 13 as the first mask signal M1. Furthermore, the control circuit 11 outputs the signal (M2={2n(1'b1)}) in which all of the 2n bits are 1 to the MASK circuit 14 as the second mask signal M2. Consequently, the MASK circuit 13 sets all of the bits of the circuit delay measurement value Q that are output by the DDM 12 to 1. Furthermore, because the MASK circuit 14 receives an input of the signal in which all of the bits are 1 as the signal that is output by the MASK circuit 13 and further receives an input of the second mask signal M2 in which all of the bits are 1, the MASK circuit 14 outputs the signal in which all of the bits are 1 to the adder 154 in the PLL circuit 15. Consequently, the control circuit 11 stops the adaptive frequency control with respect to the PLL circuit 15.

In this state, the control circuit 11 outputs the REN signal with the value of 0 to the DDM 12 and none of the delay circuits 212 to 216 and 231 to 236 in the TDC 200 function as a ring oscillator. Furthermore, the control circuit 11 outputs the first CEN signal with the value of 0 to the DDM 12 and the counters 261 and 62 are in the state in which the counters do not perform a count. Furthermore, the control circuit 11 outputs the second CEN signal with the value of 0 to the DCO 155 in the PLL circuit 15 and the counter 320 in the DCO 155 is in the state in which the counter does not perform a count. Furthermore, in this state, because the control circuit 11 does not control the DCO 155, the control circuit 11 may output an appropriate value as the control signal CS.

Thereafter, the control circuit 11 changes the value of the REN signal that is to be output to the DDM 12 to 1. Then, the control circuit 11 waits for a 5 clock cycle. Here, if the value of the REN signal is changed to 1, all of the delay circuits 212 to 216 and 231 to 236 in the TDC 200 function as a ring oscillator. Thus, the control circuit 11 waits until the oscillation of the delay circuits 212 to 216 and 231 to 236 that have functioned as the ring oscillator becomes stable. Therefore, the period of time for which the control circuit 11 waits may also be another period of time as long as the oscillation of the delay circuits 212 to 216 and 231 to 236 functioning as the ring oscillator becomes stable.

Then, the control circuit 11 changes the first CEN signal that is output to the DDM 12 to 1. Thereafter, the control circuit 11 waits a predetermined $G_1$ clock cycle. The $G_1$ clock cycle mentioned here is the period of time in which the value of the first CEN signal becomes 1 and the period of time in which the counters 261 and 262 are allowed to count the oscillation signal of the delay circuits 212 to 216 and 231 to 236 that have functioned as the ring oscillator. Namely, the $G_1$ clock cycle corresponds to the period of time $T_{CEN1}$ illustrated in FIG. 5.

Then, after waiting for the $G_1$ clock cycle, the control circuit 11 changes the first CEN signal that is output to the DDM 12 to 0, stops the count performed by the counters 261 and 262, and then waits for the 1 clock cycle. Thereafter, the control circuit 11 changes the value of the REN signal that is output to the DDM 12 to 1, cancels the function of the ring oscillator performed by the delay circuits 212 to 216 and 231 to 236, and returns the TDC 200 to the normal operation in which the voltage variation is converted to the delay variation and a time difference is measured.

Then, the control circuit 11 acquires the first CNT that is the average count values of the counters 261 and 262 in the $G_1$ clock cycle from the averaging circuit 270 in the DDM 12. Then, the control circuit 11 divides the period of time $T_{CEN1}$ for which the first CEN signal is output by the first CNT and obtains the oscillation cycle of the delay circuits 212 to 216 and 231 to 236 that have functioned as the ring oscillator. Furthermore, the control circuit 11 divides the obtained oscillation cycle by the number of the delay circuits 212 to 216 and 231 to 236. Consequently, the control circuit 11 obtains the delay time of a single delay circuit out of the delay circuits 212 to 216 and 231 to 236. The delay time of a single delay circuit out of the delay circuits 212 to 216 and 231 to 236 is the delay time of a single delay circuit out of the PCs 221 to 224 and corresponds to the measurement time resolution $T_{TDC}$ of the TDC 200.

For example, if the time of the 1 clock cycle is $T_{GCLK}$, the period of time $T_{CEN1}$ is $G_1 \times T_{GCLK}$. Thus, the control circuit 11 obtains the oscillation cycle of the delay circuits 212 to 216 and 231 to 236 as the $G_1 \times T_{GCLK}$/first CNT. Then, the control circuit 11 obtains the delay time of a single delay circuit out of the delay circuits 212 to 216 and 231 to 236 as ($G_1 \times T_{GCLK}$/first CNT)/2(n+1). Namely, the control circuit 11 obtains the measurement time resolution of the TDC 200 as $T_{TDC} = (G_1 \times T_{GCLK}/\text{first CNT})/2(n+1)$.

Then, regarding the control signals $CS_0[h-1:0]$ to $CS_{2n-1}[h-1:0]$, the control circuit 11 outputs the signals to the adder 154 by setting all of h bits to 1. Consequently, the control circuit 11 performs the setting to the state to the state in which the adjustment of the number of driving gates to be turned on due to the control signal CS is canceled, i.e., the state to the initial state of the control signal CS.

Then, the control circuit 11 sets the high order n bits in the second mask signal M2 to 1 and sets the low order n bits to 0. Namely, the control circuit 11 sets the second mask signal M2 to M2={n(1'b1), n(1'b0)}. Consequently, the MASK circuit 14 sets the low order n bits in the signal in which all of the bits output from the MASK circuit 13 is 1 to 0. Namely, the MASK circuit 14 outputs the signal in which the high order n bits are 1 and the low order n bits are 0 to the adder 154 as the detection signal. Consequently, the control circuit 11 controls the operation such that the detection signal in which the phase of the comparison clock signal matches the phase of the reference clock signal is input to the adder 154.

Then, the control circuit 11 inputs a feedback control stop (Feedback (FB) STOP) signal with the value of 1 to the PLL circuit 15 and sets the feedback control of the PLL circuit 15 to OFF. Consequently, the control circuit 11 controls the operation such that the feedback control is not performed in the PLL circuit 15 when the control signal CS is adjusted.

Then, the control circuit 11 changes the value of the second CEN signal that is output to the DCO 155 in the PLL circuit 15 from 0 to 1. Consequently, the control circuit 11 starts the count of the counter 320. Thereafter, the control circuit 11 waits for the $G_2$ clock cycle. The $G_2$ clock cycle mentioned here is the period of time in which the value of the second CEN signal becomes 1 and is the period of time for which the count of the oscillation signal output from the oscillator formed by the driving gates 301 and 302 is to be performed by the counter 320. Namely, the $G_2$ clock cycle corresponds to the period of time $T_{CEN2}$ illustrated in FIG. 10.

If the period of time $T_{CEN2}$ has elapsed after the change of the value of the second CEN signal to 1, the control circuit 11 changes the value of the second CEN signal from 1 to 0. Consequently, the control circuit 11 stops the count of the counter 320. Thereafter, the control circuit 11 acquires, from the counter 320 of the DCO 155, the second CNT that is the number of counts of the oscillation signals output from the oscillator formed by the driving gates 301 and 302.

Then, the control circuit 11 divides the period of time in which the value of the second CEN signal becomes 1 by the second CNT and calculates $T_{DCO}$ that is the oscillation cycle of the oscillator formed by the driving gates 301 and 302. For example, if the duration of the 1 clock cycle is $T_{GCLK}$, the period of time $T_{CEN2}$ is $G_2 \times T_{GCLK}$. Then, the control circuit 11 obtains the oscillation cycle of the oscillator formed by the driving gates 301 and 302 as $T_{DCO}=G_2 \times T_{GCLX}$/second CNT.

Then, the control circuit 11 selects a single adjustment target from among the control signals $CS_0[h-1:0]$ to $CS_{2n-1}[h-1:0]$. Then, the control circuit 11 changes the value of the most significant bit in the selected control signal CS to 0.

Then, the control circuit 11 changes the value of the second CEN signal that is output to the DCO 155 in the PLL circuit 15 from 0 to 1. Thereafter, the control circuit 11 waits for the $G_2$ clock cycle. After the period of time $T_{CEN2}$ has elapsed, the control circuit 11 changes the value of the second CEN signal from 1 to 0. Thereafter, the control circuit 11 acquires the second CNT that is the number of counts of the oscillation signal output from the oscillator formed by the driving gates 301 and 302 from the counter 320 of the DCO 155. Then, the control circuit 11 calculates $T_{DCO}$ that is the oscillation cycle of the oscillator formed by the driving gates 301 and 302. Then, the control circuit 11 subtracts the oscillation cycle in the case where all of the bits are 1 from the oscillation cycle in the case where the value of the most significant bit in the selected control signal CS is set to 0. Then, the control circuit 11 determines whether the subtraction result is equal to or greater than $T_{TDC}$ that is the measurement time resolution of the TDC 200.

The control circuit 11 sequentially and repeatedly increases the number of bits having the value of 0 from the most significant bit in the control signal CS that is targeted for the adjustment, acquires the second CNT, and calculates $T_{DCO}$. Then, the control circuit 11 repeats the processing of subtracting the oscillation cycle in the case where all of the bits in the control signal CS selected from the calculated $T_{DCO}$ are 1 until the subtraction result becomes equal to or greater than $T_{TDC}$ that is the measurement time resolution of the TDC 200. Here, if the number of bits having the value of 0 is increased in the control signal CS, the number of the on-off circuits 310 that output 0 in the case where the value of the detection signal is 0 is increased. Namely, if the number of bits having the value of 0 is increased in the control signal CS, the number of driving gates 302 that are stopped is increased. Consequently, because the control circuit 11 increases the number of bits having the value of 0 in the control signal CS, the cycle modulation time resolution of the DCO 155 becomes rough.

If the subtraction result is equal to or greater than $T_{TDC}$ that is the measurement time resolution of the TDC 200, the control circuit 11 selects one of the control signals $CS_0[h-1:0]$ to $CS_{2n-1}[h-1:0]$ as the subsequent adjustment target and performs processing of determining the bits having the value of 0 from among the bits in the selected control signal CS. The control circuit 11 repeats the processing of determining the bits having the value of 0 performed on all of the control signals $CS_0[h-1:0]$ to $CS_{2n-1}[h-1:0]$.

In this way, the control circuit 11 performs the adjustment such that the delay time added, by each of the control signals CS, to the oscillator formed by the driving gates 301 and 302 matches the delay time among the signals that are output from the PCs 221 to 224 and 251 to 254. Here, the measurement time resolution of the TDC 200 is the delay time among the signals that are output from the PCs 221 to 224. Then, the number of control signals CS matches the number of signals that are output by the PCs 221 to 224 and 251 to 254. Consequently, by adjusting the oscillation cycle using each of the control signals CS, the control circuit 11 can match the cycle modulation time resolution of the DCO 155 with the measurement time resolution. Namely, the control circuit 11 performs the processing of matching the cycle modulation time resolution of the DCO 155 to the cycle modulation time resolution of the DCO 155 by setting the cycle modulation time resolution of the DCO 155 to the maximum and gradually making the cycle modulation time resolution rough by increasing the number of bits having the value of 0 in the control signal CS.

Figure 11:
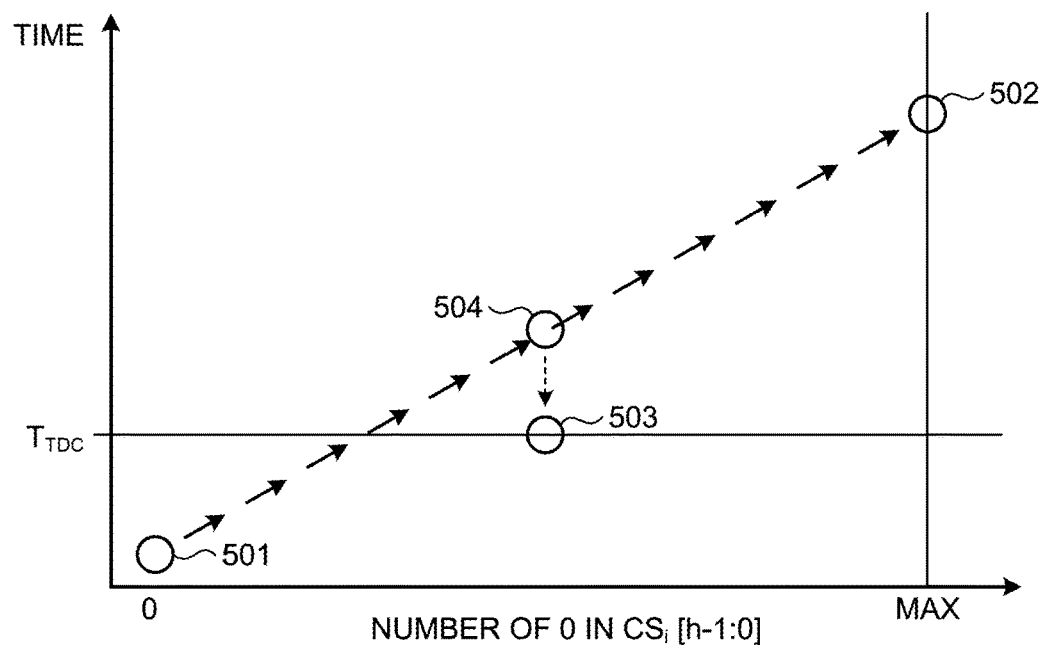
FIG. 11 is a diagram illustrating adjustment of the time resolution in a case in which the cycle modulation time resolution of the DCO is lower than the measurement time resolution of the TDC.

FIG. 11 is a diagram illustrating adjustment of the time resolution in a case in which the cycle modulation time resolution of the DCO is lower than the measurement time resolution of the TDC. In FIG. 11, the vertical axis represents the time and the horizontal axis represents the number of bits having the value of 0 in the control signals $CS_0[h-1:0]$ to $CS_{2n-1}[h-1:0]$. In FIG. 11, although the vertical axis represents the time, because the time resolution is determined in accordance with the oscillation cycle of the oscillator formed by the driving gates 301 and 302, it can also be said that the vertical axis represents the time resolution.

A time resolution 501 is the cycle modulation time resolution of the DCO 155 in the case where all of the bits in the control signal CS are 1. The time resolution 501 indicates a case in which the cycle modulation time resolution of the DCO 155 is the highest. Furthermore, a time resolution 502 is a cycle modulation time resolution of the DCO 155 in the case where all of the bits in the control signal CS are 0. The time resolution 501 indicates a case in which the cycle modulation time resolution of the DCO 155 is the lowest.

By increasing the number of bits having the value of 0 in the control signal CS, the control circuit 11 gradually makes the cycle modulation time resolution of the DCO 155 rough in the direction from the time resolution 501 to the time resolution 502 and matches the cycle modulation time resolution of the DCO 155 to the measurement time resolution of the TDC 200. In this case, the control circuit 11 acquires a time resolution 503 as the cycle modulation time resolution of the DCO 155 matched with the measurement time resolution of the TDC 200. Here, a time resolution 504 is the cycle modulation time resolution of the DCO 155 in the case where the control signal CS is not used. Namely, if the process is faster than that of the reference condition, by giving the control signal CS, the control circuit 11 makes the cycle modulation time resolution of the DCO 155 smaller and changes the time resolution from the time resolution 503 to the time resolution 504.

Figure 12:
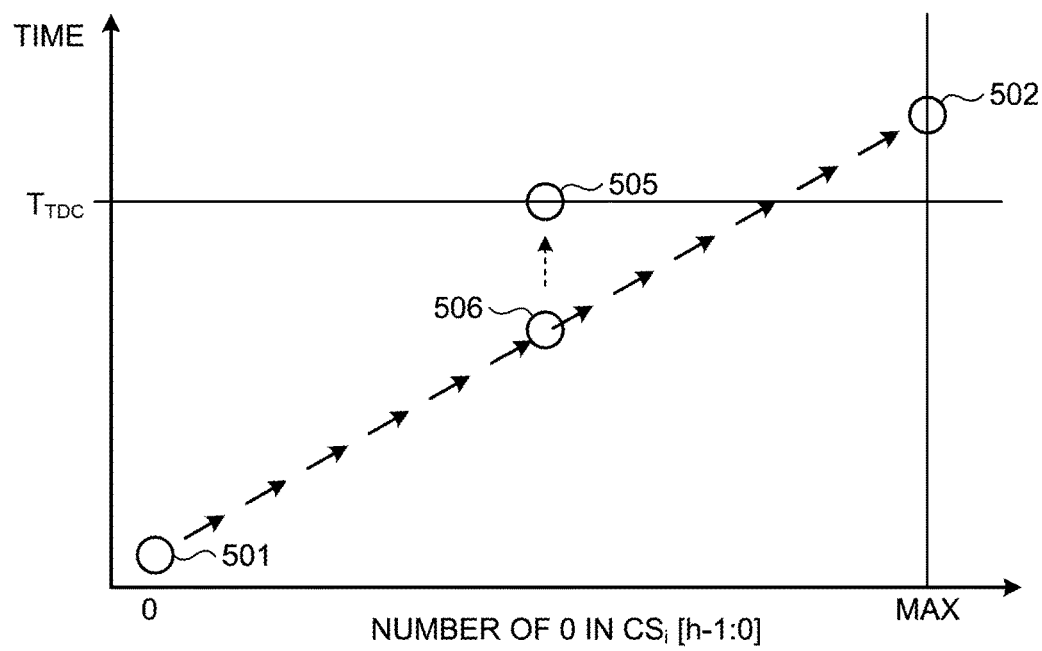
FIG. 12 is a diagram illustrating adjustment of the time resolution in a case in which the cycle modulation time resolution of the DCO is higher than the measurement time resolution of the TDC.

FIG. 12 is a diagram illustrating adjustment of the time resolution in a case in which the cycle modulation time resolution of the DCO is higher than the measurement time resolution of the TDC. In FIG. 12, the vertical axis represents the time and the horizontal axis represents the number of bits having the value of 0 included in the control signals $CS_0[h-1:0]$ to $CS_{2n-1}[h-1:0]$.

By increasing the number of bits having the value of 0 included in the control signal CS, the control circuit 11 makes the cycle modulation time resolution of the DCO 155 rough in the direction from the time resolution 501 to the time resolution 502 and matches the cycle modulation time resolution of the DCO 155 to the measurement time resolution of the TDC 200. In this case, the control circuit 11 acquires a time resolution 505 as the cycle modulation time resolution of the DCO 155 matched with the measurement time resolution of the TDC 200. Here, a time resolution 506 is the cycle modulation time resolution of the DCO 155 in the case where the control signal CS is not used. Namely, if the process is slower than that of the reference condition, by giving the control signal CS, the control circuit 11 makes the cycle modulation time resolution of the DCO 155 rough in the direction from the time resolution 506 to the time resolution 505.

A description will be continued by referring back to FIG. 1. The control circuit 11 outputs signal (M2={2n(1'b1)}) in which all of the bits are 1 to the MASK circuit 14 as the second mask signal M2. Consequently, the control circuit 11 sets the signal output from the MASK circuit 13 to the state in which the MASK circuit 14 outputs the signal without masking the signal. Then, the control circuit 11 changes the value of the feedback control stop (Feedback (FB) STOP) signal that is input to the PLL circuit 15 from 1 to 0 and sets the feedback control of the PLL circuit 15 to ON. Consequently, the control circuit 11 resumes the feedback control of the PLL circuit 15. Thereafter, the control circuit 11 outputs the signal (M1={n(1'b1), n(1'b0)}) in which the high order n bits are 1 and the low order n bits are 0 to the MASK circuit 13 as the first MASK signal. Consequently, the control circuit 11 sets the signal output from the DDM 12 to the state in which the MASK circuit 13 outputs the signal without masking the signal.

Figure 13:
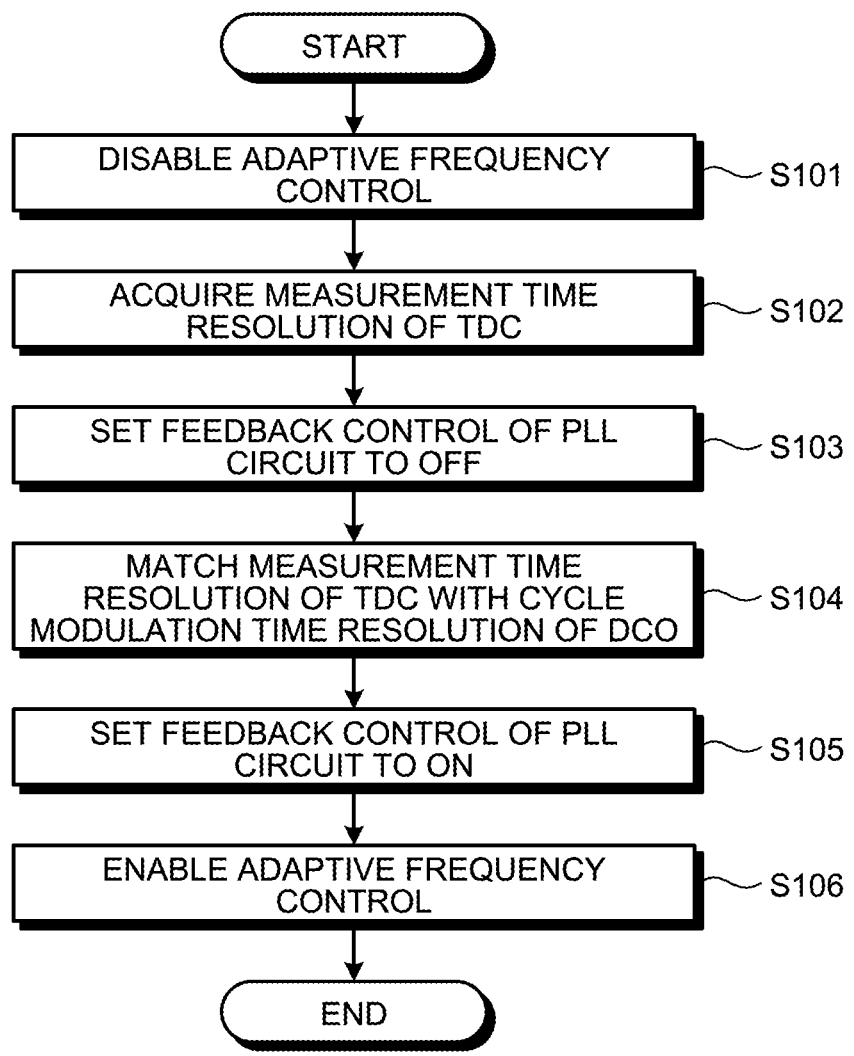
FIG. 13 is a flowchart illustrating the DCO cycle modulation time resolution calibration according to the first embodiment.

In the following, an outline of the processing of DCO cycle modulation time resolution calibration according to the embodiment will be described with reference to FIG. 13. FIG. 13 is a flowchart illustrating the DCO cycle modulation time resolution calibration according to the first embodiment.

The control circuit 11 sets all of the bits included in the first mask signal M1 and the second mask signal M2 to 1, outputs the signals to the MASK circuits 13 and 14, and disables the adaptive frequency control performed by the DDM 12 (Step S101). In this case, the first mask signal M1 and the second mask signal M2 are represented by M1=M2={2n(1'b1)}.

Then, the control circuit 11 acquires the measurement time resolution of the TDC 200 (Step S102).

Then, the control circuit 11 sets the feedback control of the PLL circuit 15 to OFF (Step S103).

Then, the control circuit 11 increases the number of bits having the value of 0 in the control signal CS and makes the cycle modulation time resolution of the DCO 155 rough in the direction from the time resolution 501 to the time resolution 502. Then, the control circuit 11 matches the cycle modulation time resolution of the DCO 155 to the measurement time resolution of the TDC 200 (Step S104).

Thereafter, the control circuit 11 sets the feedback control of the PLL circuit 15 to ON (Step S105).

Furthermore, the control circuit 11 enables the adaptive frequency control performed by the DDM 12 (Step S106). Thereafter, the control circuit 11 outputs the control signal CS that is in a state in which the cycle modulation time resolution of the DCO 155 matches the measurement time resolution of the TDC 200 to the adder 154 and operates the PLL circuit 15 to which the adaptive frequency control is given. Namely, in the state in which the cycle modulation time resolution of the DCO 155 matches the measurement time resolution of the TDC 200, the PLL circuit 15 supplies, to the data path circuit 160, the clock signal to which the adaptive frequency control is given.

Figure 14:
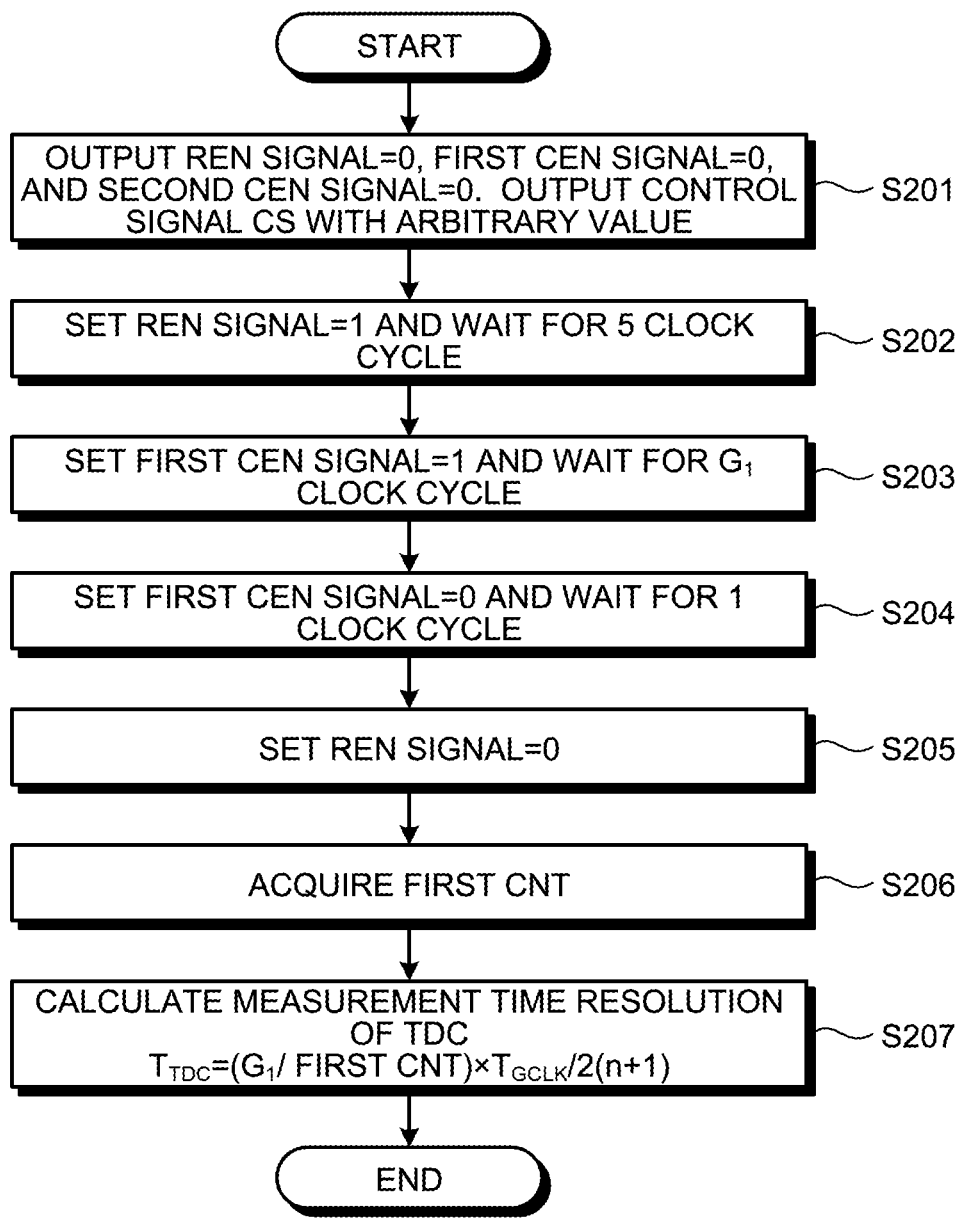
FIG. 14 is a flowchart illustrating acquisition processing of the measurement time resolution of the TDC.

In the following, the flow of the processing of acquiring the measurement time resolution of the TDC 200 will be described in detail with reference to FIG. 14. FIG. 14 is a flowchart illustrating acquisition processing of the measurement time resolution of the TDC. Each of the pieces of the processing illustrated in FIG. 14 is a specific example of the processing performed at Step 5102 illustrated in FIG. 13.

The control circuit 11 outputs the REN signal having the value of 0 and the first CEN signal having the value of 0 to the DDM 12 and outputs the second CEN signal having the value of 0 to the DCO 155. Furthermore, the control circuit 11 outputs the control signal CS having an arbitrary value to the adder 154 (Step S201).

Then, the control circuit 11 changes the value in the REN signal from 0 to 1 and then waits for the 5 clock cycle (Step S202). Consequently, the control circuit 11 waits until the delay circuits 212 to 216 and 232 to 236 function as a ring oscillator and become stable.

Then, after having changed the value of the first CEN signal from 0 to 1 and started the count of the counters 261 and 262, the control circuit 11 waits for the $G_1$ clock cycle (Step S203). During the period of time for which the control circuit 11 waits, the counters 261 and 262 counts, as a clock, the oscillation signals of the delay circuits 212 to 216 and 232 to 236 that have functioned as the ring oscillator.

Then, after the control circuit 11 changes the value in the first CEN signal from 1 to 0 and stops the count of the counters 261 and 262, the control circuit 11 waits for the 1 clock cycle (Step S204).

Then, the control circuit 11 changes the REN signal from 1 to 0 and cancels the function of the ring oscillator formed by the delay circuits 212 to 216 and 232 to 236 (Step S205).

Thereafter, the control circuit 11 acquires the first CNT that is the average value of the count values of the counters 261 and 262 from the averaging circuit 270 (Step S206).

Then, the control circuit 11 divides the counted period of time of the counters 261 and 262 by the first CNT and calculates the oscillation cycle of the delay circuits 212 to 216 and 232 to 236 that have functioned as the ring oscillator. Then, by dividing the calculated oscillation cycle by the number of the delay circuits 212 to 216 and 232 to 236, the control circuit 11 acquires $T_{TDC}$ that is the measurement time resolution of the TDC 200. In this case, the control circuit 11 calculates $T_{TDC}$ that is the measurement time resolution of the TDC 200 as $T_{TDC}=(G_1/\text{first CNT})\times T_{GCLK}/2(n+1)$ (Step S207).

Figure 15:
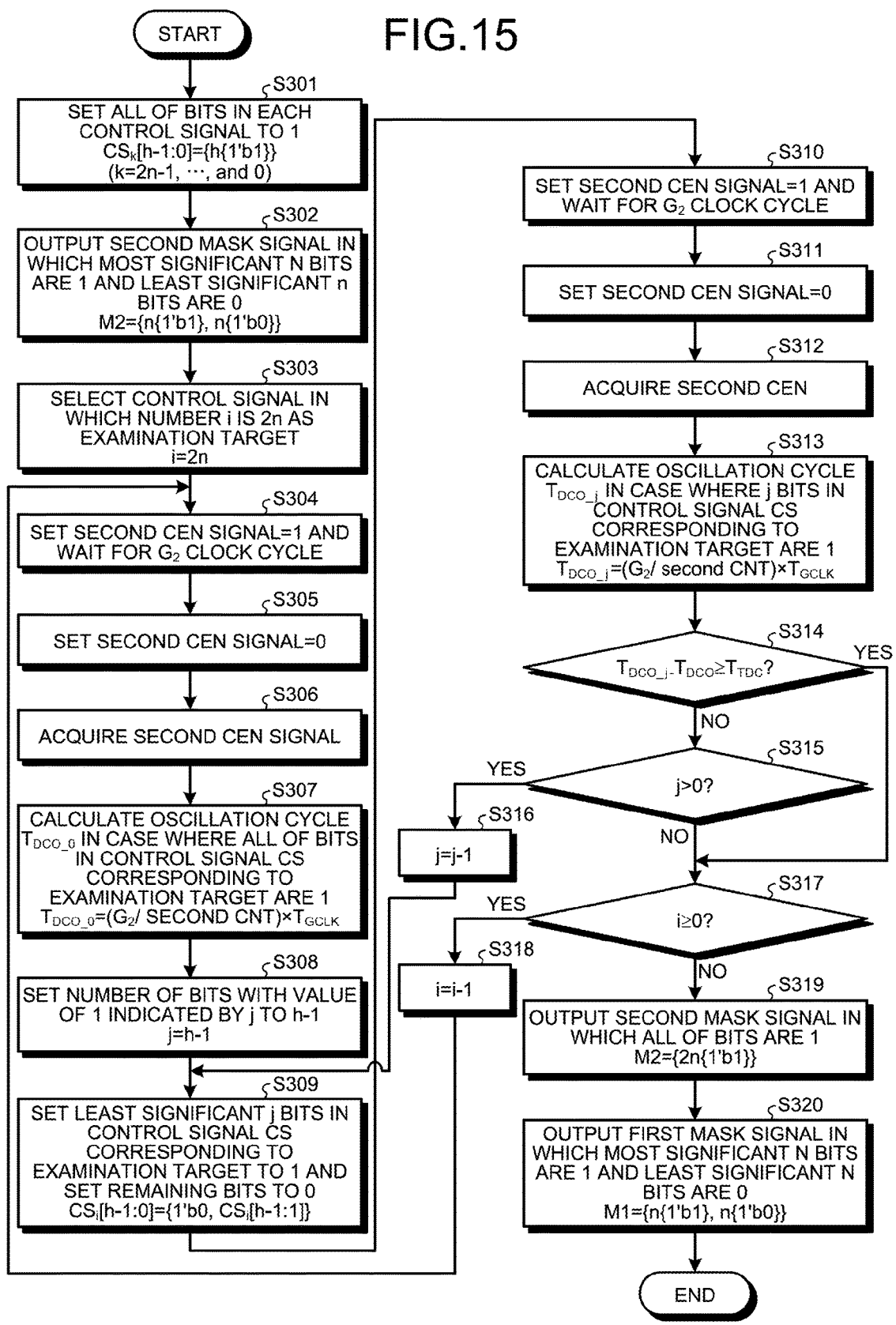
FIG. 15 is a flowchart illustrating processing of matching the cycle modulation time resolution of the DCO with the measurement time resolution of the TDC.

In the following, the flow of the processing of matching the cycle modulation time resolution of the DCO 155 and the measurement time resolution of the TDC 200 will be described in detail with reference to FIG. 15. FIG. 15 is a flowchart illustrating processing of matching the cycle modulation time resolution of the DCO with the measurement time resolution of the TDC. Each of the pieces of the processing illustrated in FIG. 15 is a specific example of the processing performed at Step S104 illustrated in FIG. 13.

The control circuit 11 sets all of the bits in each of the control signals $CS_0[h-1:0]$ to $CS_{2n-1}[h-1:0]$ to 1. Namely, the control circuit 11 sets $CS_k[h-1:0]=\{h(1'b1)\}$ (k=2n-1, 2n-2, . . . , and 0) (Step S301).

Then, the control circuit 11 outputs the second mask signal M2 in which the high order n bits are 1 and the low order n bits are 0 to the MASK circuit 14. Namely, the control circuit 11 outputs the second mask signal M2 that is M2={n(1'b1), n(1'b0)} (Step S302). Consequently, the PLL circuit 15 receives an input of the detection signal in a case in which the circuit delay of the pseudo critical path circuit 121 matches the circuit delay of the pseudo critical path circuit 122.

Then, the control circuit 11 selects the control signal in which the number of the control signal CS of the examination target is i and the number i is 2n as the control signal CS corresponding to the examination target. Namely, the control circuit 11 sets i=2n (Step S303). Here, regarding the control signals CS, the number in accordance with the position of each of the bits included in the detection signal is allocated as illustrated in FIG. 8.

Then, after the control circuit 11 changes the value of the second CEN signal from 0 to 1 and allows the counter 320 to start the count, the control circuit 11 waits for the $G_2$ clock cycle (Step S304). During the period of time for which the control circuit 11 waits, the counter 320 counts, as a clock, the oscillation signals output from the oscillator formed by the driving gates 301 and 302.

Then, the control circuit 11 changes the second CEN signal from 1 to 0 and stops the count performed by the counter 320 (Step S305).

Thereafter, the control circuit 11 acquires the second CEN from the counter 320 (Step S306).

Then, the control circuit 11 calculates $T_{DCO\_0}$ that is the oscillation cycle in the case where all of the bits in the control signal CS that is the examination target is 1. Specifically, the control circuit 11 calculates the oscillation cycle in the case where all of the bits in the control signals CS corresponding to the examination target are 1 as $T_{DCO\_0}=(G_2/\text{second CNT})\times T_{GCKL}$ (Step S307).

Then, the control circuit 11 sets the number of bits having the value of 1 included in the control signal CS corresponding to the examination target to j and sets j=h-1 (Step S308).

Then, the control circuit 11 sets the least significant j bits in the control signal CS corresponding to the examination target to 1 and sets the remaining bits to 0. Namely, the control circuit 11 sets $CS_i[h-1:0]=\{1'b0, CS_i[h-1:1]\}$ (Step S309).

Then, after the control circuit 11 changes the value in the second CEN signal from 0 to 1 and allows the counter 320 to start the count, the control circuit 11 waits for the $G_2$ clock cycle (Step S310). During the period of time for which the control circuit 11 waits, the counter 320 counts the oscillation signals output from the oscillator formed by the driving gates 301 and 302 as a clock.

Then, the control circuit 11 changes the second CEN signal from 1 to 0 and allows the counter 320 to stop the count (Step S311).

Thereafter, the control circuit 11 acquires the second CEN from the counter 320 (Step S312).

Then, the control circuit 11 calculates $T_{DCO\_j}$ that is the oscillation cycle in the case where the J bits in the control signal CS corresponding to the examination target are 1. Specifically, the control circuit 11 calculates the oscillation cycle in the case where the j bits included in the control signal CS corresponding to the examination target are 1 as $T_{DCO\_j}=(G_2/\text{second CNT})\times T_{GCKL}$ (Step S313).

Then, the control circuit 11 calculates the value by subtracting $T_{DCO\_0}$ that is the oscillation cycle in the case where all of the bits in the control signal corresponding to the examination target are 1 from $T_{DCO\_j}$ corresponding to the oscillation cycle in the case where j bits in the control signal corresponding to the examination target are 1. Then, the control circuit 11 determines whether the subtraction result is equal to or greater than $T_{TDC}$ that is the measurement time resolution of the TDC 200. Namely, the control circuit 11 determines whether $T_{DCO\_j}-T_{DCO\_0} \geq T_{TDC}$ (Step S314). In the case of $T_{DCO\_j}-T_{DCO\_0} \geq T_{TDC}$ (Yes at Step S314), the control circuit 11 stores therein the number of bits having the value of 1 included in the control signal CS corresponding to the examination target as j and proceeds to Step S317.

In contrast, in the case of $T_{DCO\_j}-T_{DCO\_0} < T_{TDC}$ (No at Step S314), the control circuit 11 determines whether j is greater than 0 (Step S315). If j is greater than 0 (Yes at Step S315), the control circuit 11 decrements j by 1 (Step S316) and returns to Step S309.

In contrast, if j is equal to or less than 0 (No at Step S315), the control circuit 11 determines whether i is equal to or greater than 0 (Step S317). In this case, the control circuit 11 stores the number of bits having the value of 1 in the control signal CS targeted for the examination as h that is the number of all of the bits included in the control signal CS. Then, if i is equal to or greater than 0 (Yes at Step S317), the control circuit 11 decrements i by 1 (Step S318) and returns to Step S304.

In contrast, if i is less than 0 (No at Step S317), the control circuit 11 outputs the second mask signal M2 in which all of the bits are 1 to the MASK circuit 14. Namely, the control circuit 11 outputs the second mask signal M2 that is M2={2n{1'b1}} (Step S319).

Then, the control circuit 11 outputs the first mask signal M1 in which the high order n bits are 1 and the low order n bits are 0 to the MASK circuit 13. Namely, the control circuit 11 outputs the first mask signal M1 that is M1={n{1'b1}, n{1'b0}} (Step S320). Consequently, the control circuit 11 resumes the adaptive frequency control with respect to the PLL circuit 15 performed by the DDM 12. Thereafter, the control circuit 11 sets the control signals $CS_0[h-1:0]$ to $CS_{2n-1}[h-1:0]$ such that the number of determined bits is 1 and outputs the control signals to the adder 154.

As described above, the CPU 1 according to the embodiment determines the control signal CS such that the measurement time resolution of the TDC 200 matches the cycle modulation time resolution of the DCO 155 that are used for the adaptive frequency control and inputs the control signal CS to the DCO 155.

Figure 16:
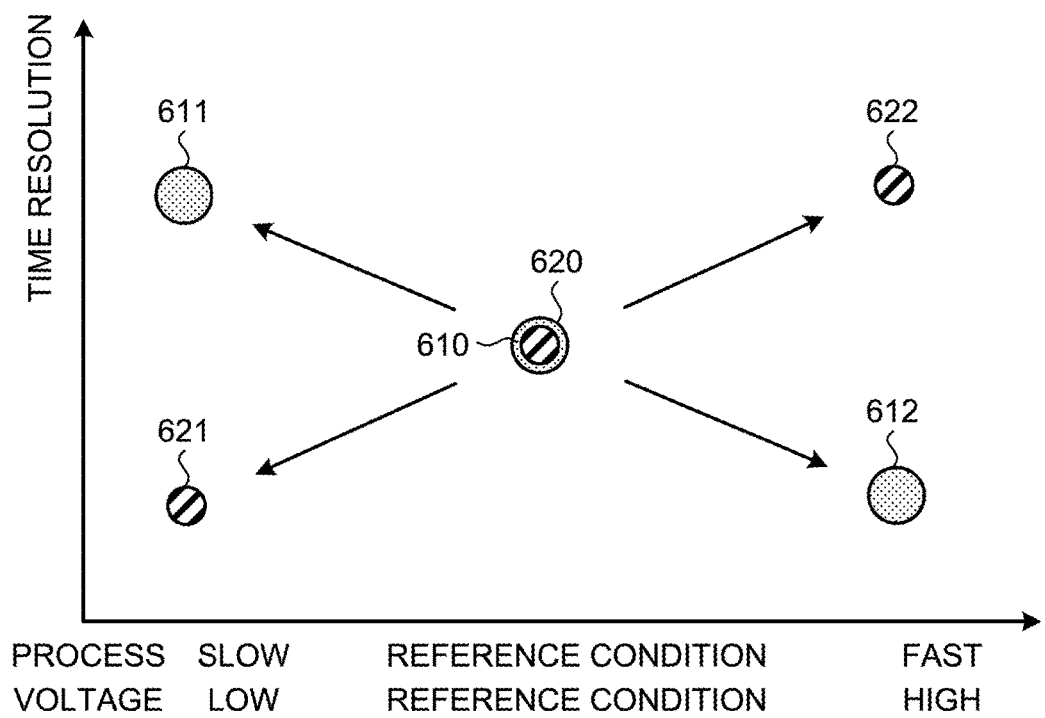
FIG. 16 is a diagram illustrating the effect of the variation in the process and the time resolution of a change in voltage.

In the following, the relationship between the measurement time resolution of the TDC 200 and the cycle modulation time resolution of the DCO 155 in the case where the process or the voltage is changed will be described with reference to FIG. 16. FIG. 16 is a diagram illustrating the effect of the variation in the process and the time resolution of a change in voltage. In FIG. 16, the vertical axis represents the time resolution, which indicates that the time resolution becomes rough in the direction of the vertical axis. Furthermore, the horizontal axis illustrated in FIG. 16 represents a process or a voltage.

A time resolution 610 is the cycle modulation time resolution of the DCO 155 in the case where the VPT condition is the reference condition. Furthermore, a time resolution 620 is the measurement time resolution of the TDC 200 in the case where the reference condition is the VPT condition. Then, the cycle modulation time resolution of the DCO 155 becomes rough if a process becomes slow or if a voltage is decreased and results in a time resolution 611. In contrast, the measurement time resolution of the TDC 200 becomes small if a process becomes slow or a voltage is decreased and results in a time resolution 621. In contrast, if a process becomes faster or if a voltage is increased, the cycle modulation time resolution of the DCO 155 becomes small and results in a time resolution 612. In contrast, the measurement time resolution of the TDC 200 becomes rough if a process becomes faster or if a voltage is increased and results in a time resolution 622.

In this way, regarding the time resolution, the accuracy of the measurement time resolution of the TDC 200 and the accuracy of the cycle modulation time resolution of the DCO 155 are in the reverse direction with respect to a variation in the processes or a change in the voltage. Consequently, with the CPU that performs conventional adaptive frequency control, regarding the time resolution, the accuracy of the adaptive frequency control is decreased due to a variation in the processes or a change in the voltage.

In contrast, the CPU 1 according to the embodiment matches the accuracy of the measurement time resolution of the TDC 200 with the accuracy of the cycle modulation time resolution of the DCO 155. Consequently, the CPU 1 according to the embodiment can suppress an increase in a difference between the measurement time resolution of the TDC 200 and the cycle modulation time resolution of the DCO 155 due to a variation in the processes or a change in the voltage. Consequently, the CPU 1 according to the embodiment can improve the accuracy of the adaptive frequency control in the case where a variation in the processes or a change in the voltage occurs.

Modification

Figure 17:
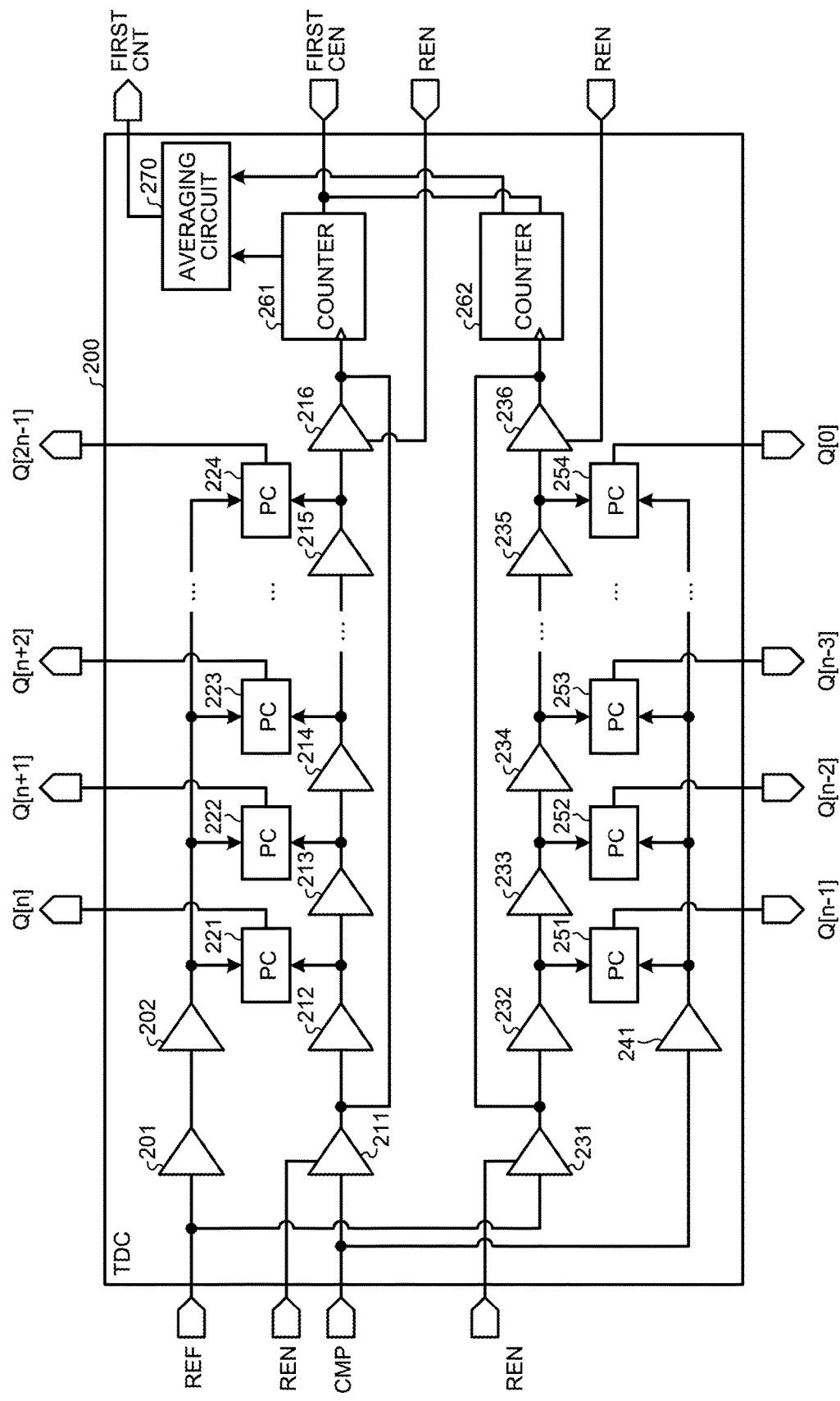
FIG. 17 is a circuit diagram illustrating a TDC according to a modification in detail.

FIG. 17 is a circuit diagram illustrating a TDC according to a modification in detail. The modification has the configuration in the case where buffers are used as the delay circuits 201 and 202, 211 to 216, 231 to 236, and 241 arranged in the TDC 200.

Each of the delay circuits 212 to 216 configured by using the buffers gives a delay to a comparison clock signal. The PCs 221 to 224 compare the comparison clock signal to which the delay is given with the reference clock signal and outputs the comparison result. Each of the PCs 221 to 224 outputs 1 if the comparison clock signal is forwarded compared with the reference clock signal and outputs 0 if the comparison clock signal is delayed compared with the reference clock signal.

Each of the delay circuits 232 to 236 configured by using the buffers gives a delay to the reference clock signal. Each of the PCs 251 to 254 compares the comparison clock signal to which the delay is given with the reference clock signal and outputs the comparison result. Each of the PCs 251 to 254 outputs 1 if the comparison clock signal is forwarded compared with the reference clock signal and outputs 0 if the comparison clock signal is delayed compared with the reference clock signal.

In this way, similarly to the first embodiment, even in the case in which the buffers are used for the delay circuits 201 and 202, 211 to 216, 231 to 236, and 241, the TDC 200 also outputs the circuit delay measurement value Q that indicates whether the comparison clock signal is delayed or forwarded with respect to the reference clock signal.

As described above, adaptive frequency control can also be implemented even in the case in which the TDC 200 is configured by using the delay circuits 201 and 202, 211 to 216, 231 to 236, and 241. Consequently, even if the TDC 200 is used, the CPU 1 can improve the accuracy of the adaptive frequency control in the case where a variation in the processes or a change in the voltage occurs.

[b] Second Embodiment

Figure 18:
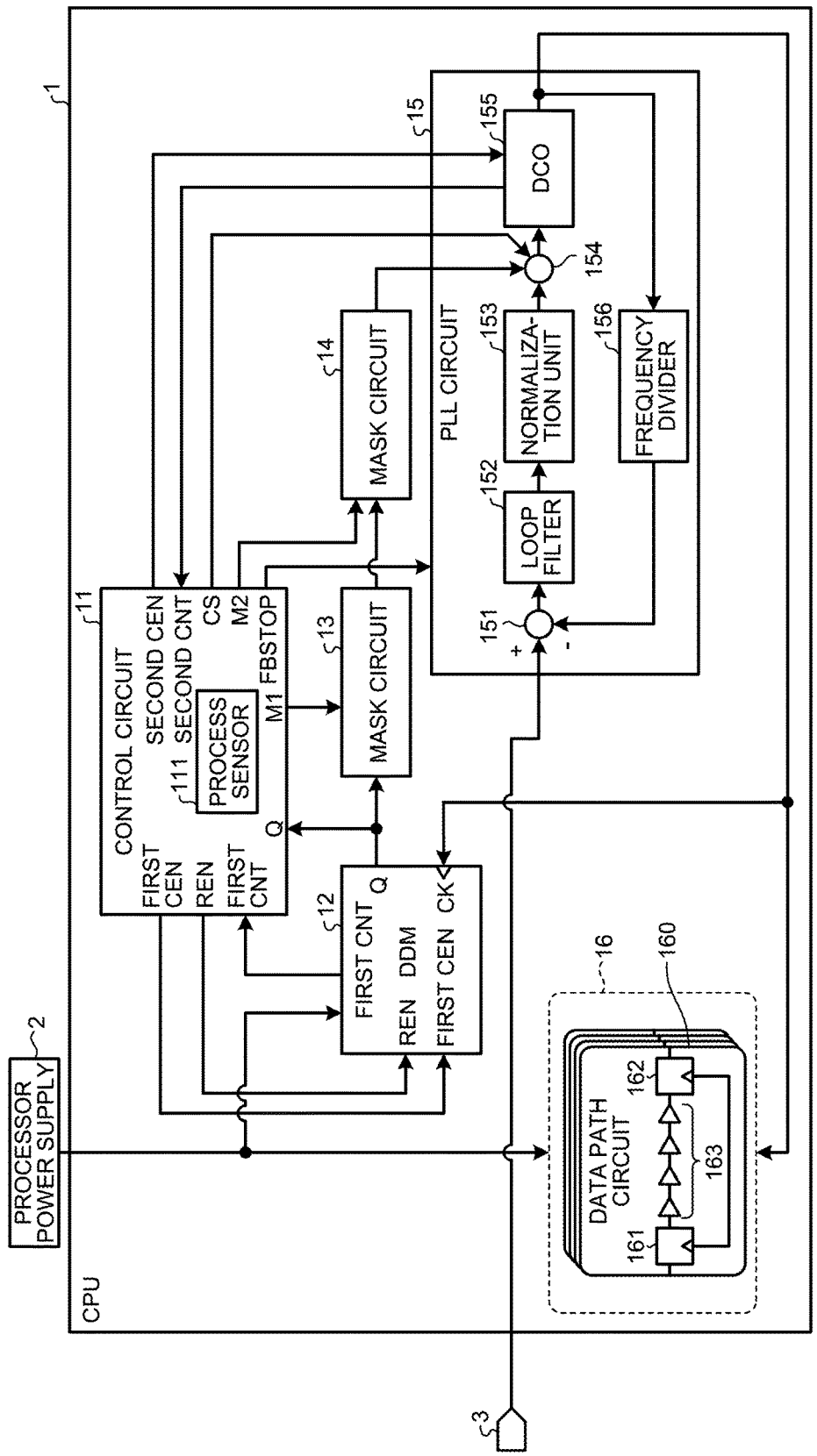
FIG. 18 is a block diagram illustrating a CPU according to a second embodiment.

FIG. 18 is a block diagram illustrating a CPU according to a second embodiment. In accordance with a case in which the process is slower or faster than the reference condition, the CPU 1 according to the embodiment determines the method of matching the cycle modulation time resolution of the DCO 155 with the measurement time resolution of the TDC 200 by selecting an increase or a decrease in the number of bits having the value of 0 included in the control signal CS. In a description below, descriptions of the components having the same function as those described in the first embodiment will be omitted.

In the CPU 1 according to the embodiment, a process sensor 111 is mounted on the control circuit 11. The process sensor 111 determines the manufacturing variation in the CPU 1. Specifically, the process sensor 111 determines whether the process of the CPU 1 slower or faster than a case of the process performed under the reference condition. Here, in the embodiment, a case in which the process sensor 111 is mounted on the control circuit 11 has been described; however, the process sensor 111 may also be outside the control circuit 11 and the process sensor 111 may also send the determination result of the manufacturing variation in the CPU 1 to the control circuit 11.

The control circuit 11 acquires the determination result of the manufacturing variation in the CPU 1 from the process sensor 111. Then, the control circuit 11 acquires the first CNT from the averaging circuit 270 in the DDM 12. Then, the control circuit 11 performs calculation by using $T_{TDC}$ that is the measurement time resolution of the TDC 200.

If the process is faster than a case of the process performed under the reference condition, the control circuit 11 acquires the second CNT in the case where all of the bits included in the control signal CS are set to 1 from the counter 320 in the DCO 155. Then, the control circuit 11 calculates $T_{DCO}$ that is the oscillation cycle of the oscillator formed by the driving gates 301 and 302. Thereafter, the control circuit 11 acquires the second CNT from the counter 320 of the DCO 155 while increasing the number of 0 from the most significant bit in the control signal CS. Then, the control circuit 11 calculates $T_{DCO}$ that is the oscillation cycle of the oscillator formed by the driving gates 301 and 302. Then, the control circuit 11 subtracts $T_{DCO}$ in the case of using the control signal CS having all of the bits of 1 from $T_{DCO}$ in the case of using the control signal CS in which 0 is increased and specifies the control signal CS in the case where the subtraction result is equal to or greater than $T_{TDC}$ that is the measurement time resolution of the TDC 200. The control circuit 11 repeatedly performing the processing described above on all of the control signals CS and determines the control signal CS that matches the cycle modulation time resolution of the DCO 155 and the measurement time resolution of the TDC 200.

In contrast, if the process is slower than a case of the process performed under the reference condition, the control circuit 11 acquires the second CNT in the case where all of the bits included in the control signal CS are set to 0 from the counter 320 in the DCO 155. Then, the control circuit 11 calculates $T_{DCO}$ that is the oscillation cycle of the oscillator formed by the driving gates 301 and 302. Thereafter, the control circuit 11 acquires the second CNT from the counter 320 in the DCO 155 while increasing the number of 1 from the least significant bit in the control signal CS. Then, the control circuit 11 calculates $T_{DCO}$ that is the oscillation cycle of the oscillator formed by the driving gates 301 and 302. Then, the control circuit 11 subtracts $T_{DCO}$ in the case of using the control signal CS in which 1 is increased from $T_{DCO}$ in the case of using the control signal CS having all of the bits of 0 and then specifies the control signal CS in which the subtraction result is equal to or greater than $T_{TDC}$ that is the measurement time resolution of the TDC 200 and that has the shortest $T_{DCO}$. The control circuit 11 repeatedly performs the processing described above on all of the control signals CS and determines the control signal CS that matches the cycle modulation time resolution of the DCO 155 and the measurement time resolution of the TDC 200.

Figure 19:
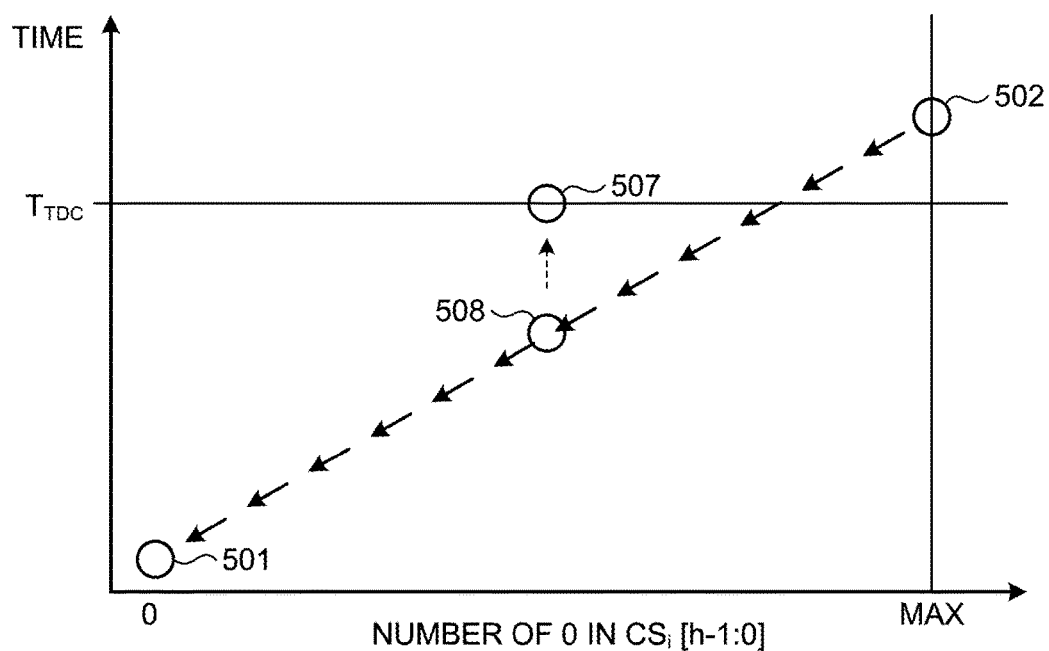
FIG. 19 is a diagram illustrating adjustment of the time resolution in a case in which the cycle modulation time resolution of a DCO according to the second embodiment is higher than the measurement time resolution of a TDC.

FIG. 19 is a diagram illustrating adjustment of the time resolution in a case in which the cycle modulation time resolution of a DCO according to the second embodiment is higher than the measurement time resolution of a TDC. In FIG. 19, the vertical axis represents the time and the horizontal axis represents the number of bits having the value of 0 included in the control signals $CS_0[h-1:0]$ to $CS_{2n-1}[h-1:0]$.

By increasing the number of bits having the value of 1 included in the control signal CS, the control circuit 11 makes the cycle modulation time resolution of the DCO 155 small in the direction from the time resolution 502 to the time resolution 501 and matches the cycle modulation time resolution of the DCO 155 with the measurement time resolution of the TDC 200. In this case, the control circuit 11 acquires a time resolution 507 as the cycle modulation time resolution of the DCO 155 that is matched with the measurement time resolution of the TDC 200. Here, a time resolution 508 is the cycle modulation time resolution of the DCO 155 in the case where the control signal CS is not used. Namely, if the process is slower than a case of the process performed under the reference condition, by giving the control signal CS, the control circuit 11 makes the cycle modulation time resolution of the DCO 155 rough in the direction from the time resolution 508 to the time resolution 507.

Figure 20:
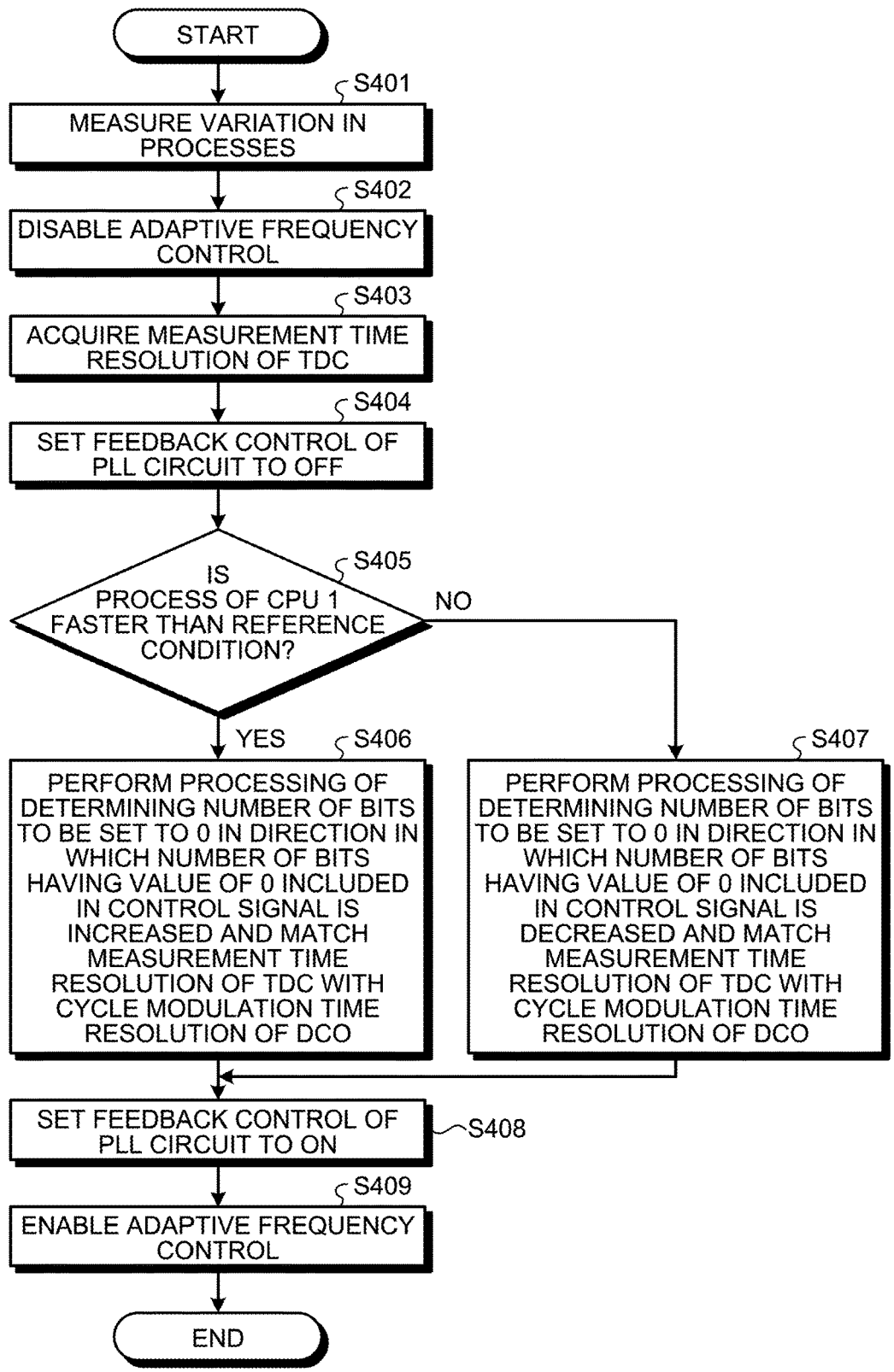
FIG. 20 is a flowchart illustrating the DCO cycle modulation time resolution calibration according to the second embodiment.

In the following, the outline of the processing of the DCO cycle modulation time resolution calibration according to the embodiment will be described with reference to FIG. 20. FIG. 20 is a flowchart illustrating the DCO cycle modulation time resolution calibration according to the second embodiment.

The process sensor 111 determines the variation in the process of the CPU 1 (Step S401). Then, the control circuit 11 acquires the determination result of the variation in the process of the CPU 1 from the process sensor 111.

The control circuit 11 sets all of the bits in the first mask signal M1 and the second mask signal M2 to 1, outputs the first mask signal M1 and the second mask signal M2 to the MASK circuits 13 and 14, respectively, and disables the adaptive frequency control performed by the DDM 12 (Step S402).

Then, the control circuit 11 acquires the measurement time resolution of the TDC 200 (Step S403).

Then, the control circuit 11 sets the feedback control of the PLL circuit 15 to OFF (Step S404).

Then, the control circuit 11 determines, the determination result obtained by the process sensor 111, whether the process of the CPU 1 is faster than the reference condition (Step S405).

If the process of the CPU 1 is faster than the reference condition (Yes at Step S405), the control circuit 11 performs the processing of determining the number of bits to be set to 0 in the direction in which the number of bits having the value of 0 included in the control signal CS is increased. Then, the control circuit 11 matches the cycle modulation time resolution of the DCO 155 with the measurement time resolution of the TDC 200 (Step S406).

In contrast, if the process is delayed with respect to the reference condition (No at Step S405), the control circuit 11 performs the processing of determining the number of bits to be set to 0 in the direction in which the number of bits having the value of 0 included in the control signal CS is decreased. Then, the control circuit 11 matches the cycle modulation time resolution of the DCO 155 with the measurement time resolution of the TDC 200 (Step S407).

Thereafter, the control circuit 11 sets the feedback control of the PLL circuit 15 to ON (Step S408).

Furthermore, the control circuit 11 enables the adaptive frequency control performed by the DDM 12 (Step S409). Thereafter, the control circuit 11 outputs, to the adder 154, the control signal CS in which the cycle modulation time resolution of the DCO 155 is matched with the measurement time resolution of the TDC 200 and operates the PLL circuit 15 to which the adaptive frequency control is given. Namely, the PLL circuit 15 supplies, in the state in which the cycle modulation time resolution of the DCO 155 is matched with the measurement time resolution of the TDC 200, the clock signal to which the adaptive frequency control has been given to the data path circuit 160.

As described above, if the process is faster than the reference condition, the CPU 1 according to the embodiment changes the control signal CS such that the cycle modulation time resolution of the DCO 155 becomes rough and matches the cycle modulation time resolution of the DCO 155 with the measurement time resolution of the TDC 200. Furthermore, if the process is slower than the reference condition, the CPU 1 according to the embodiment changes the control signal CS such that the cycle modulation time resolution of the DCO 155 becomes small and matches the cycle modulation time resolution of the DCO 155 with the measurement time resolution of the TDC 200.

At this time, if the process is faster than the reference condition, the convergence is faster if the control signal CS is changed such that the cycle modulation time resolution of the DCO 155 becomes rough compared with a case in which the control signal CS is changed such that the cycle modulation time resolution of the DCO 155 becomes small. In contrast, if the process is slower than the reference condition, the convergence is faster if the control signal CS is changed such that the cycle modulation time resolution of the DCO 155 becomes small compared with the case in which the control signal CS becomes rough. Consequently, the control circuit 11 according to the embodiment can reduce the time needed to determine the control signal CS that matches the cycle modulation time resolution of the DCO 155 with the measurement time resolution of the TDC 200 compared with the case of the first embodiment.

According to an aspect of an embodiment, the present invention can improve the accuracy of adaptive frequency control.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An information processing device comprising:
   a voltage variation detection unit that measures a time difference between delay time that is in accordance with voltage variations;
   an oscillator that generates an oscillation signal having a cycle that is in accordance with an input signal;
   a frequency divider that generates a divided signal by dividing the oscillation signal;
   an adder that inputs, to the oscillator, a signal obtained by adding a second signal that changes an oscillation cycle of the oscillator in accordance with the time difference measured by the voltage variation detection unit to a first signal that is in accordance with a phase difference between the divided signal and a reference signal; and
   a control unit that obtains a measurement time resolution of the voltage variation detection unit and that matches a cycle modulation time resolution of the oscillator with the measurement time resolution of the voltage variation detection unit.

2. The information processing device according to claim 1, wherein
   the oscillator includes a ring oscillator that includes a plurality of driving gates, and
   the control unit matches, by using a control signal that changes the number of driving gates to be driven, the cycle modulation time resolution of the oscillator with the measurement time resolution of the voltage variation detection unit.

3. The information processing device according to claim 1, wherein
   the voltage variation detection unit includes a plurality of delay circuits each of which sequentially gives a delay to a standard signal at the time of a reference voltage and a comparison signal at the time of the occurrence of the voltage variations and the voltage variation detection unit measures the delay time based on a comparison between the standard signal to which the delay is given by each of the delay circuits and the comparison signal before the delay is given and based on a comparison between the comparison signal to which the delay is given by each of the delay circuits and the standard signal before the delay is given, and
   the control unit allows the delay circuits to function as a ring oscillator and obtains the measurement time resolution based on an oscillation cycle of the delay circuits that are allowed to function as the ring oscillator.

4. The information processing device according to claim 1, wherein the control unit matches the cycle modulation time resolution with the measurement time resolution of the voltage variation detection unit by making the cycle modulation time resolution rough from the smallest state.

5. The information processing device according to claim 1, further comprising a detection unit that detects whether a process of the information processing device is faster or slower than a reference process, wherein
   when the process is faster than the reference process, the control unit matches the cycle modulation time resolution with the measurement time resolution of the voltage variation detection unit by making the cycle modulation time resolution rough from the smallest state, and
   when the process is slower than the reference process, the control unit matches the cycle modulation time resolution with the measurement time resolution of the voltage variation detection unit by making the cycle modulation time resolution small from the most rough state.

6. An information processing method comprising:
   obtaining a measurement time resolution of a voltage variation detection circuit that measures a time difference between delay time that is in accordance with voltage variations;
   matching, with the measurement time resolution of the voltage variation detection circuit, a cycle modulation time resolution of an oscillator that generates an oscillation signal having a cycle that is in accordance with a signal obtained by adding a second signal that changes an oscillation cycle in accordance with the time difference to a first signal that is in accordance with a phase difference between a divided signal obtained by dividing the oscillation signal of the oscillator and a reference signal.

7. A non-transitory computer-readable recording medium having stored therein an information processing program that causes a computer to execute a process comprising:
   obtaining a measurement time resolution of a voltage variation detection circuit that measures a time difference between delay time that is in accordance with voltage variations;
   matching, with the measurement time resolution of the voltage variation detection circuit, a cycle modulation time resolution of an oscillator that generates an oscillation signal having a cycle that is in accordance with a signal obtained by adding a second signal that changes an oscillation cycle in accordance with the time difference to a first signal that is in accordance with a phase difference between a divided signal obtained by dividing the oscillation signal of the oscillator and a reference signal.

\* \* \* \* \*